United States Patent
Shimura et al.

(10) Patent No.: US 10,353,291 B2
(45) Date of Patent: Jul. 16, 2019

(54) METHOD FOR FORMING PHOTOSENSITIVE RESIN LAYER, METHOD FOR PRODUCING PHOTORESIST PATTERN, AND METHOD FOR PRODUCING PLATED MOLDED ARTICLE

(71) Applicant: TOKYO OHKA KOGYO CO., LTD., Kawasaki-shi (JP)

(72) Inventors: Eiichi Shimura, Kawasaki (JP); Shinji Kumada, Kawasaki (JP); Aya Momozawa, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/066,767

(22) Filed: Mar. 10, 2016

(65) Prior Publication Data
US 2016/0274459 A1 Sep. 22, 2016

(30) Foreign Application Priority Data

Mar. 18, 2015 (JP) ................................ 2015-055412

(51) Int. Cl.
| G03F 7/004 | (2006.01) |
| G03F 7/039 | (2006.01) |
| G03F 7/09 | (2006.01) |
| G03F 7/16 | (2006.01) |
| G03F 7/40 | (2006.01) |

(52) U.S. Cl.
CPC .......... G03F 7/0392 (2013.01); G03F 7/0045 (2013.01); G03F 7/0397 (2013.01); G03F 7/09 (2013.01); G03F 7/168 (2013.01); G03F 7/40 (2013.01)

(58) Field of Classification Search
CPC ....... G03F 7/0392; G03F 7/0045; G03F 7/168
USPC ..................................................... 430/275.1
See application file for complete search history.

(56) References Cited

U.S. PATENT DOCUMENTS

| 4,912,018 | A | * | 3/1990 | Osuch | ..................... G03F 7/004 430/176 |
| 5,800,964 | A | * | 9/1998 | Sato | ....................... G03F 7/0045 430/270.1 |
| 5,892,095 | A | * | 4/1999 | Hada | ..................... C07C 309/65 430/325 |
| 9,182,663 | B2 | | 11/2015 | Sugihara et al. | |
| 2004/0081914 | A1 | * | 4/2004 | Imai | ....................... B41C 1/1008 430/281.1 |
| 2006/0141389 | A1 | | 6/2006 | Okui et al. | |
| 2012/0129106 | A1 | * | 5/2012 | Hirano | ................... G03F 7/0226 430/286.1 |
| 2014/0017611 | A1 | | 1/2014 | Sugihara et al. | |

FOREIGN PATENT DOCUMENTS

| JP | H09-176112 | 7/1997 |
| JP | H11-052562 | 2/1999 |
| JP | 2006-154569 A | 6/2006 |
| JP | 2014-006514 A | 1/2014 |
| WO | WO 2006/059747 A1 | 6/2006 |

OTHER PUBLICATIONS

Notification of Reasons for Refusal issued in Japanese Patent Application No. 2015-055412, dated Sep. 11, 2018.

* cited by examiner

Primary Examiner — Daborah Chacko-Davis
(74) Attorney, Agent, or Firm — Knobbe, Martens, Olson & Bear LLP

(57) ABSTRACT

A method of forming a photosensitive resin layer including laminating a photosensitive resin layer including a chemically amplified positive-type photosensitive resin composition which includes an acid generator which generates an acid upon light exposure and generates an acid by heating on a metal surface having catalytic activity, a resin whose solubility in alkali increases under the action of an acid, and an organic solvent, on an catalytic activity-containing metal surface of a substrate; and heating the photosensitive resin layer, so that the solubility in alkali of the photosensitive resin layer increases as the layer becomes closer to an interface with the substrate.

19 Claims, 2 Drawing Sheets

PREBAKING    <u>100°C-180s</u>    <u>105°C-180s</u>    <u>110°C-180s</u>

520mJ/cm²    520mJ/cm²    540mJ/cm²

10um Space

PREBAKING    <u>80°C-180s</u>    <u>90°C-180s</u>    <u>100°C-180s</u>

360mJ/cm²    480mJ/cm²    540mJ/cm²

10um Space

| PEB | 80deg.C-90s | 90deg.C-90s | 100deg.C-90s |
|---|---|---|---|
| | 480mJ/cm² | 480mJ/cm² | 500mJ/cm² |
| 10um Space |  |  |  |

| Dev. Time : | 120s X 1 | 40s X 3 | 60s X 2 |
|---|---|---|---|
| | 580mJ/cm² | 480mJ/cm² | 520mJ/cm² |
| 10um Space |  |  |  |
| Dev. Time : | 45s X 2 | 70s X 2 | 60s X 3 |
| | 520mJ/cm² | 480mJ/cm² | 440mJ/cm² |
| 10um Space |  |  |  |

METHOD FOR FORMING PHOTOSENSITIVE RESIN LAYER, METHOD FOR PRODUCING PHOTORESIST PATTERN, AND METHOD FOR PRODUCING PLATED MOLDED ARTICLE

This application claims priority to Japanese Patent Application No. 2015-055412, filed Mar. 18, 2015, the entire content of which is incorporated herein by reference.

BACKGROUND OF THE INVENTION

Field of the Invention

The present invention relates to a method for forming a photosensitive resin layer, a method for producing a photoresist pattern, and a method for producing a plated molded article, which use a chemically amplified positive-type photosensitive resin composition.

Related Art

At present, photofabrication is the mainstream of precise and fine processing technologies. Photofabrication is the general name of a technology in which a photoresist composition is applied to an article surface to be processed to form a photoresist layer, the photoresist layer is patterned by a photolithography technique, and the patterned photoresist layer (photoresist pattern) is used as a mask to perform chemical etching, electrolytic etching, or electroforming mainly including electroplating, thereby producing various precise parts such as a semiconductor package.

In recent years, high density packaging technologies have progressed in semiconductor packages along with downsizing of electronics devices, and the increase in package density has been developed on the basis of mounting multi-pin thin film in packages, miniaturizing of package size, two-dimensional packaging technologies in flip-tip systems or three-dimensional packaging technologies. In these types of high density packaging techniques, connecting terminals, including protruding electrodes (mounting terminals) such as bumps that protrude above the package, or metal posts or the like that connect rewiring extending from peripheral terminals on the wafer with the mounting terminals, are disposed on the surface of the substrate with high precision.

A photosensitive resin composition is used for photofabrication described above, and as the photosensitive resin composition, a chemically amplified photosensitive resin composition including an acid generator is known (see Japanese Unexamined Patent Application, Publication No. H9-176112, Japanese Unexamined Patent Application, Publication No. H11-52562, or the like). In the chemically amplified photosensitive resin composition, an acid is generated from an acid generator with radiation (exposed to light), diffusion of the acid is promoted by heating process, and an acid catalytic reaction occurs with respect to a base resin in the composition, whereby alkali solubility of the composition is changed.

Such a chemically amplified positive-type photosensitive resin composition is used for, for example, forming a wiring layer or forming connecting terminals such as bumps or metal posts by plating. Specifically, a photosensitive resin layer (photoresist layer) having a desired film thickness is formed on a substrate, which is a support, by using a chemically amplified photosensitive resin composition, and the layer is exposed to light via a predetermined mask pattern and developed, thereby forming a photoresist pattern in which an area where the wiring layer is to be formed or the bumps or metal posts are to be formed is selectively removed (peeled off). In addition, a conductor such as copper is embedded into the area (non-resist section) in which the layer is removed by plating, and then wiring layer or the bumps or metal posts, which are plated molded article, can be formed by removing the photoresist pattern surrounding the embedded area.

SUMMARY OF THE INVENTION

In forming the plated molded article by the aforementioned plating, it is desirable that a width of the bottom (side in contact with the substrate surface) in the plated molded article to be formed be the same as the width of the top facing the bottom, or greater than the width of the top. By doing the above, an undercut is not generated and an angle formed by the substrate area near the plated molded article and the plated molded article becomes 90 degrees or more. Thus, the shape of the plated molded article is stabilized. In the subsequent laminating such as filling or coating with an insulating material, it is expected that adhesion between the substrate and a filling material is enhanced, or a risk of void occurrence is reduced, which means enhancement of device reliability. In addition, it is desirable to arbitrarily set the angle formed by the substrate area near the plated molded article and the plated molded article depending on a device type or device step to be applied.

However, in the method for forming a photoresist pattern for forming the wiring layer or forming the connecting terminals such as bumps or metal posts by using the chemically amplified positive-type photosensitive resin composition known in the related art, as disclosed in Japanese Unexamined Patent Application, Publication No. H9-176112, Japanese Unexamined Patent Application, Publication No. H11-52562, or the like is used, it is difficult to form a photoresist pattern including a non-resist section having a vertical shape in which the width of the top and the width of the bottom are the same as each other, or a shape in which the width of the bottom is greater than that of the top, by changing the alkali solubility of the photosensitive resin layer by a means other than light exposure. Therefore, in a case where the chemically amplified positive-type photoresist composition disclosed in Japanese Unexamined Patent Application, Publication No. H9-176112, Japanese Unexamined Patent Application, Publication No. H11-52562, or the like is used, it is not easy to arbitrarily set the angle formed by the substrate area near the plated molded article and the plated molded article.

In addition, it is desirable to arbitrarily set the angle formed by the substrate area near the plated molded article and the plated molded article, even in the same photoresist.

The present invention has been made taking this problem into consideration, and has an object of providing a method for forming a photosensitive resin layer, a method for producing a photoresist pattern, and a method for producing a plated molded article, which can control the shape of a photoresist pattern, for example, so as to provide a photoresist pattern including the non-resist section of which the width of the bottom (surface side of the substrate) is greater than the width of the top (surface side of the photosensitive resin layer), in a case where the photoresist pattern including the photosensitive resin layer is formed by using the chemically amplified positive-type photosensitive resin composition.

As a result of a thorough study in order to achieve the aforementioned object, the present inventors found that by coating a catalytic activity-having metal surface of the substrate with the chemically amplified positive-type photosensitive resin composition containing an acid generator, and heating the formed photosensitive resin layer, the alkali solubility within the photosensitive resin layer can be changed depending on a distance from the substrate by an acid generated from the acid generator, regardless of light exposure, and the change along with the change of alkali solubility within the photosensitive resin layer by an acid generated with light exposure can achieve the above object, thereby completing the present invention. Specifically, the present invention provides the following.

According to a first aspect of the present invention, there is provided a method for forming a photosensitive resin layer, the method including: laminating a photosensitive resin layer composed of a chemically amplified positive-type photosensitive resin composition that includes an acid generator (A) which contains an acid generator (A1) which generates an acid upon light exposure and generates an acid by heating on a metal surface having catalytic activity, a resin (B) whose solubility in alkali increases under the action of an acid, and an organic solvent (S), on the metal surface of a substrate having catalytic activity; and heating the photosensitive resin layer, so that the solubility in alkali of the photosensitive resin layer is more increased as the layer becomes closer to an interface with the substrate.

According to a second aspect of the present invention, there is provided a method for producing a photoresist pattern including: regioselectively exposing the photosensitive resin layer formed by the method for forming a photosensitive resin layer according to the first aspect to light; and developing the exposed photosensitive resin layer to form a photoresist pattern, in which in a cross-sectional shape of a non-resist section in a cross section perpendicular to the substrate and traversing a resist section and the non-resist section in the photoresist pattern, the relationship between the width L1 at an interface with the substrate and the width L2 of the surface on the opposite side of the substrate is represented by L2≤L1.

According to a third aspect of the present invention, there is provided a method for producing a plated molded article including: plating the non-resist section in the photoresist pattern formed by the method for producing a photoresist pattern according to the second aspect.

According to a fourth aspect of the present invention, there is provided a method for producing a photoresist pattern including: laminating a photosensitive resin layer composed of a chemically amplified positive-type photosensitive resin composition that includes an acid generator (A) which contains an acid generator (A1) which generates an acid upon light exposure and generates an acid by heating on a metal surface having catalytic activity, a resin (B) whose solubility in alkali increases under the action of an acid, and an organic solvent (S), on the metal surface having catalytic activity of a substrate; heating the photosensitive resin layer; regioselectively exposing the photosensitive resin layer to light; and developing the exposed photosensitive resin layer to form a photoresist pattern whose shape is controlled by an acid generated on the metal surface.

According to the present invention, it is possible to provide the method for forming a photosensitive resin layer, the method for producing a photoresist pattern, and the method for producing a plated molded article, which can control the shape of a photoresist pattern, for example, as the photoresist pattern including the non-resist section of which the width of the bottom (surface side of the substrate) is greater than the width of the top (surface side of the photosensitive resin layer), in a case where the photoresist pattern including the photosensitive resin layer is formed by using the chemically amplified positive-type photosensitive resin composition.

DETAILED DESCRIPTION OF THE INVENTION

Chemically Amplified Positive-Type Photosensitive Resin Composition

Figure 1A:
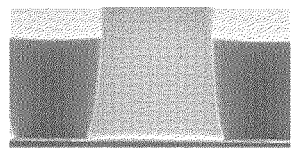
FIG. 1A is a SEM photograph of a cross-sectional shape of each photoresist pattern obtained in Example 1 and FIG. 1B is a SEM photograph of a cross-sectional shape of each photoresist pattern obtained in Comparative Example 1.

A chemically amplified positive-type photosensitive resin composition used in the present invention (hereinafter, may be simply referred to as "photosensitive resin composition") contains at least an acid generator (A1), resin (B) whose solubility in alkali increases under the action of an acid, and an organic solvent (S).

The use of the photosensitive resin composition in the present invention is not particularly limited, and the composition can be used for various purposes to which the photosensitive resin composition is generally applied from the related art. Preferred examples of the purpose of the photosensitive resin composition of the present invention include formation of connecting terminals such as bumps and metal posts, or a wiring pattern, in manufacturing electronic parts such as circuit boards and CSPs (chip-size packages) mounted to the circuit boards. Hereinafter, each component contained in the photosensitive resin composition of the present invention will be described.

Acid Generator (A)

An acid generator (A) contains an acid generator (A1) (hereinafter, may be simply referred to as an "acid generator (A1)") which generates an acid upon light exposure and generates an acid on the metal surface having catalytic activity by heating.

The acid generator (A1) generates an acid upon light exposure and generates an acid on the metal surface having catalytic activity by heating. Here, in the specification, "light exposure" means irradiation with radiation (hereinafter, may be simply referred to as "light"). "The metal surface having catalytic activity" refers to a surface of the substrate described below. In addition, "heating" refers to heating conducted with respect to the photosensitive resin layer in the heating described below.

The acid generator (A1) generates an acid on the metal surface having catalytic activity by heating described above, and specifically, refers to an acid generator which generates an acid under a heating condition in which an acid is not generated in the absence of a catalytic metal element, in the presence of a metal element (hereinafter, referred to as a "catalytic metal element") constituting the metal surface having catalytic activity. The generation of the acid is caused by decomposition of the acid generator.

The acid generator (A1) does not generate an acid in the absence of the catalytic metal element, but in the presence of the catalytic metal element, and the heating condition for generating the acid is desirably about 60° C. to 150° C. for 60 seconds to 300 seconds.

As the acid generator (A1), specifically, it is possible to select an acid generator in which an acid generated under the aforementioned heating condition in the presence of the catalytic metal element can be detected according to at least one of the detection methods including nuclear magnetic resonance (NMR) and reversed phase chromatography. The specific condition of the detection method is based on Reference Example described below.

The acid generator (A1) selected by the method can be selected, for example, from the acid generators (A) described below.

The acid generator (A) is a compound which generates an acid upon light exposure, and is not particularly limited, if the compound directly or indirectly generates an acid by light exposure. When the photosensitive resin composition is applied to a variety of substrates to form a photosensitive resin layer, the film thickness of the photosensitive resin layer is not particularly limited, and the film thickness of the photosensitive resin layer is preferably 1 µm to 200 µm, more preferably 2 µm to 100 µm, and particularly preferably 3 µm to 50 µm. In a case where a plated molded article is formed by using a photoresist pattern including the photosensitive resin layer, in consideration of the shape of various terminals, wiring, or the like to be formed as the plated molded article, such a film thickness is particularly preferable.

As the acid generator (A), the acid generators according to a first aspect to a sixth aspect, which will be described below, are preferable. These acid generators according to the aspects are particularly preferable, in a case where the photosensitive resin layer having the aforementioned film thickness is formed. Hereinafter, preferred acid generators will be described as the first to sixth aspects with respect to the acid generator (A) which is preferably used in the photosensitive resin composition.

As the first aspect of the acid generator (A), a compound represented by the following formula (a1) is exemplified.

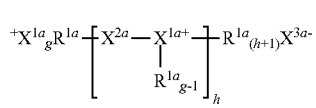
(a1)

In the formula (a1), $X^{1a}$ represents a sulfur atom or an iodine atom, having a valence of g, and g is 1 or 2. h represents the number of repeating units of the structure within parentheses. $R^{1a}$ is an organic group that is bonded to $X^{1a}$, and represents an aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms, $R^{1a}$ may be substituted with at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen, the number of $R^{1a}$'s is g+h(g-1)+1, $R^{1a}$'s may be respectively the same as or different from each other, the two or more $R^{1a}$'s may be bonded to each other directly or via —O—, —S—, —SO—, —SO$_2$—, —NH—, —NR$^{2a}$—, —CO—, —COO—, —CONH—, an alkylene group having 1 to 3 carbon atoms, or a phenylene group, and may form a ring structure containing $X^{1a}$, and $R^{2a}$ is an alkyl group having 1 to 5 carbon atoms or an aryl group having 6 to 10 carbon atoms.

$X^{2a}$ is a structure represented by the following formula (a2).

(a2)

In the formula (a2), $X^{4a}$ represents an alkylene group having 1 to 8 carbon atoms, an arylene group having 6 to 20 carbon atoms, or a divalent group of a heterocyclic compound having 8 to 20 carbon atoms, $X^{4a}$ may be substituted with at least one selected from the group consisting of an alkyl group having 1 to 8 carbon atoms, an alkoxy group having 1 to 8 carbon atoms, an aryl group having 6 to 10 carbon atoms, a hydroxyl group, a cyano group, a nitro group, and halogen. $X^{5a}$ represents —O—, —S—, —SO—, —SO$_2$—, —NH—, —NR$^{2a}$—, —CO—, —COO—, —CONH—, an alkylene group having 1 to 3 carbon atoms, or a phenylene group. h represents the number of repeating units of the structure within parentheses. $X^{4a}$'s in the number of h+1 and $X^{5a}$'s in the number of h may respectively be the same as or different from each other. $R^{2a}$ has the same definition as described above.

$X^{3a-}$ is a counter ion of onium, and a fluorinated alkyl-fluorophosphoric acid anion represented by the following formula (a17) or a borate anion represented by the following formula (a18) can be exemplified.

(a17)

In the formula (a17), $R^{3a}$ represents an alkyl group in which 80% or more of hydrogen atoms are substituted with a fluorine atom. j represents the number of $R^{3a}$ and is an integer of 1 to 5. Plural $R^{3a}$'s with respect to the number of j may be the same as or different from each other.

(a18)

In the formula (a18), $R^{4a}$ to $R^{7a}$ each independently represent a fluorine atom or a phenyl group, and all or a part of hydrogen atoms of the phenyl group may be substituted with at least one selected from the group consisting of a fluorine atom and a trifluoromethyl group.

Examples of the onium ion in the compound represented by the formula (a1) include triphenylsulfonium, tri-p-tolyl-sulfonium, 4-(phenylthio)phenyldiphenylsulfonium, bis[4-(diphenylsulfonio)phenyl]sulfide, bis[4-{bis[4-(2-hydroxyethoxy)phenyl]sulfonio}phenyl]sulfide, bis{4-[bis(4-fluorophenyl)sulfonio]phenyl}sulfide, 4-(4-benzoyl-2-chlorophenylthio)phenylbis(4-fluorophenyl)sulfonium, 7-isopropyl-9-oxo-10-thia-9,10-dihydroanthracen-2-yldi-p-tolylsulfonium, 7-isopropyl-9-oxo-10-thia-9,10-dihydroanthracen-2-yldiphenylsulfonium, 2-[(diphenyl)sulfonio]thioxanthone, 4-[4-(4-tert-butylbenzoyl)phenylthio]phenyldi-p-tolylsulfonium, 4-(4-benzoylphenylthio)phenyldiphenylsulfonium, diphenylphenacylsulfonium, 4-hydroxyphenylmethylbenzylsulfonium, 2-naphthylmethyl(1-ethoxycarbonyl)ethylsulfonium, 4-hydroxyphenylmethylphenacylsulfonium, phenyl[4-(4-biphenylthio)phenyl]4-biphenylsulfonium, phenyl[4-(4-biphenylthio)phenyl]3-biphenylsulfonium, [4-(4-acetophenylthio)phenyl]diphenylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, and 4-isobutylphenyl(p-tolyl)iodonium.

Among the onium ion in the compound represented by the formula (a1), as a preferable onium ion, a sulfonium ion represented by the following formula (a19) can be exemplified.

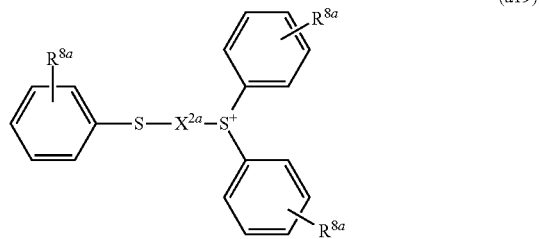
(a19)

In the formula (a19), $R^{8a}$'s each independently represent a group selected from the group consisting of a hydrogen atom, an alkyl group, a hydroxyl group, an alkoxy group, an alkylcarbonyl group, an alkylcarbonyloxy group, an alkyloxycarbonyl group, a halogen atom, an aryl group which may have a substituent, and an arylcarbonyl group. $X^{2a}$ has the same definition as $X^{2a}$ in the formula (a1).

Examples of the sulfonium ion represented by the formula (a19) include 4-(phenylthio)phenyldiphenylsulfonium, 4-(4-benzoyl-2-chlorophenylthio)phenylbis(4-fluorophenyl)sulfonium, 4-(4-benzoylphenylthio)phenyldiphenylsulfonium, phenyl[4-(4-biphenylthio)phenyl]4-biphenylsulfonium, phenyl[4-(4-biphenylthio)phenyl]3-biphenylsulfonium, [4-(4-acetophenylthio)phenyl]diphenylsulfonium, and diphenyl[4-(p-terphenylthio)phenyl]diphenylsulfonium.

In regard to the fluorinated alkylfluorophosphoric acid anion represented by the formula (a17), $R^{3a}$ represents an alkyl group substituted with a fluorine atom, and the preferable number of carbon atoms is 1 to 8, and the more preferable number of carbon atoms is 1 to 4. Examples of the alkyl group include linear alkyl groups such as methyl, ethyl, propyl, butyl, pentyl and octyl; branched alkyl groups such as isopropyl, isobutyl, sec-butyl, and tert-butyl; and cycloalkyl groups such as cyclopropyl, cyclobutyl, cyclopentyl, and cyclohexyl. The ratio of hydrogen atoms substituted with fluorine atoms in the alkyl groups is usually 80% or more, preferably 90% or more, and more preferably 100%. In a case where the substitution ratio of the fluorine atoms is less than 80%, the acid strength of the onium fluorinated alkylfluorophosphate represented by the formula (a1) decreases.

A particularly preferred example of $R^{3a}$ is a linear or branched perfluoroalkyl group having 1 to 4 carbon atoms and a substitution ratio of fluorine atoms of 100%, and examples thereof include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$, and $(CF_3)_3C$. The number of j with respect to $R^{3a}$ is an integer of 1 to 5, preferably 2 to 4, and particularly preferably 2 or 3.

Preferred examples of the fluorinated alkylfluorophosphoric acid anion include $[(CF_3CF_2)_2PF_4]^-$, $[(CF_3CF_2)_3PF_3]^-$, $[((CF_3)_2CF)_2PF_4]^-$, $[((CF_3)_2CF)_3PF_3]^-$, $[(CF_3CF_2CF_2)_2PF_4]^-$, $[(CF_3CF_2CF_2)_3PF_3]^-$, $[((CF_3)_2CFCF_2)_2PF_4]^-$, $[((CF_3)_2CFCF_2)_3PF_3]^-$, $[(CF_3CF_2CF_2CF_2)_2PF_4]^-$, and $[(CF_3CF_2CF_2)_3PF_3]^-$, and among these, $[(CF_3CF_2)_3PF_3]^-$, $[(CF_3CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$, or $[((CF_3)_2CFCF_2)_2PF_4]^-$ is particularly preferable.

Preferred examples of the borate anion represented by the formula (a18) include tetrakis(pentafluorophenyl)borate ($[B(C_6F_5)_4]^-$), tetrakis[(trifluoromethyl)phenyl]borate ($[B(C_6H_4CF_3)_4]^-$), difluorobis(pentafluorophenyl)borate ($[(C_6F_5)_2BF_2]^-$), trifluoro(pentafluorophenyl)borate ($[(C_6F_5)BF_3]^-$), and tetrakis(difluorophenyl)borate ($[B(C_6H_3F_2)_4]^-$). Among these, tetrakis(pentafluorophenyl)borate ($[B(C_6F_5)_4]^-$) is particularly preferable.

Examples of the second aspect of the acid generator (A) include a halogen-containing triazine compound such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy) styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine, and tris(2,3-dibromopropyl)-1,3,5-triazine, and a halogen-containing triazine compound represented by the following formula (a3) such as tris(2,3-dibromopropyl)isocyanurate.

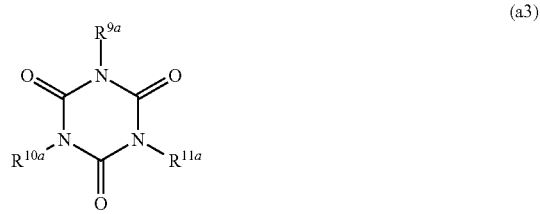
(a3)

In the formula (a3), $R^{9a}$, $R^{10a}$, and $R^{11a}$ each independently represent a halogenated alkyl group.

Examples of the third aspect of the acid generator (A) include α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile and α-(ethylsulfonyloxyimino)-1-cyclopentenylacetonitrile, and compounds represented by the following formula (a4) having an oximesulfonate group.

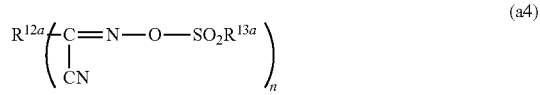

(a4)

In the formula (a4), $R^{12a}$ represents a monovalent, divalent, or trivalent organic group, $R^{13a}$ represents a substituted or unsubstituted saturated hydrocarbon group, an unsaturated hydrocarbon group or an aromatic compound group, and n represents the number of repeating units of the structure in the parentheses.

In the formula (a4), the aromatic compound group indicates a group corresponding to a compound having unique physical and chemical properties of aromatic compounds, and examples thereof include an aryl group such as a phenyl group and a naphthyl group, and a heteroaryl group such as a furyl group and a thienyl group. These may have one or more appropriate substituents such as a halogen atom, an alkyl group, an alkoxy group, and a nitro group on the rings. $R^{13a}$ is particularly preferably an alkyl group having 1 to 6 carbon atoms and examples thereof include a methyl group, an ethyl group, a propyl group, and a butyl group. In particular, compounds in which $R^{12a}$ represents an aromatic compound group and $R^{13a}$ represents an alkyl group having 1 to 4 carbon atoms are preferable.

Examples of the acid generator (A) represented by the formula (a4) include compounds in which $R^{12a}$ is any one of a phenyl group, a methylphenyl group, and a methoxyphenyl group, and $R^{13a}$ is a methyl group, when n is 1, and examples thereof include α-(methylsulfonyloxyimino)-1-phenylacetonitrile, α-(methylsulfonyloxyimino)-1-(p-methylphenyl)acetonitrile, α-(methylsulfonyloxyimino)-1-(p-methoxyphenyl)acetonitrile, and [2-(propylsulfonyloxyimino)-2,3-dihydroxythiophene-3-ylidene](o-tolyl)acetonitrile. When n is 2, examples of the acid generator (A) represented by the formula (a4) include acid generators represented by the following formulae.

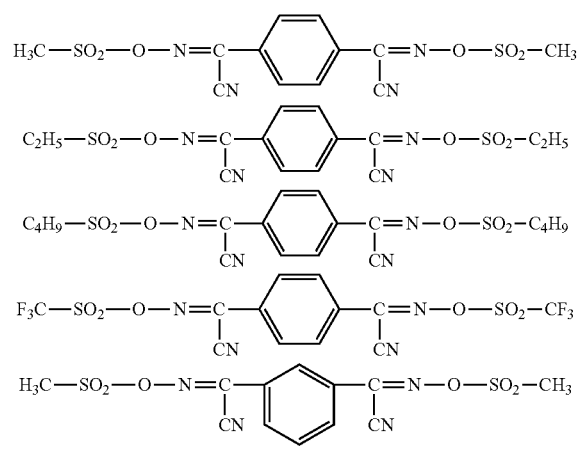

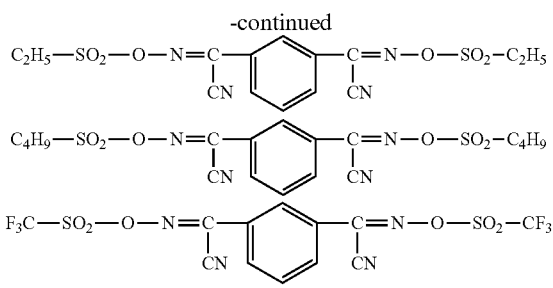

As the acid generator (A) represented by the formula (a4), when n is 2, (o-; ortho) compounds in which substituents in the number of n (n=2) represented by —C(CN)=N—O—SO$_2$R$^{13a}$ are bonded to adjacent carbon constituting R$^{12a}$, are preferable, for example, as represented by the following formulae.

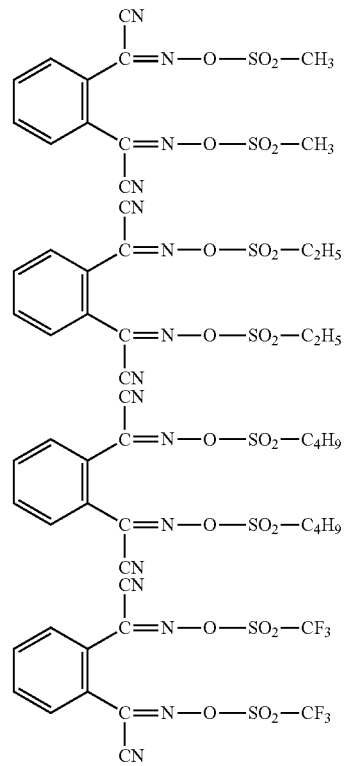

As the third aspect of the acid generator (A), the acid generator represented by the formula (a4) is preferable, among these, a compound in which n is 2, $R^{12a}$ is an aromatic compound group, and $R^{13a}$ is an alkyl group having 1 to 4 carbon atoms is preferable. In the preferable compound, $R^{12a}$ is more preferably an aryl group such as a phenyl group and a naphthyl group, and still more preferably a phenyl group. In addition, $R^{13a}$ is more preferably an alkyl group having 1 to 3 carbon atoms, and a (o-; ortho) compound in which substituents in the number of n (n=2) represented by —C(CN)=N—O—SO$_2$R$^{13a}$ are adjacent to each other is preferable.

In addition, examples of the fourth aspect of the acid generator (A) include onium salts having a naphthalene ring on a cation moiety. "Having a naphthalene ring" means to have a structure derived from naphthalene, and means that at least two ring structures and its aromatic properties are maintained. This naphthalene ring may have a substituent such as a linear or branched alkyl group having 1 to 6 carbon atoms, a hydroxyl group, and a linear or branched alkoxy group having 1 to 6 carbon atoms. The structure derived from a naphthalene ring may be a monovalent group (one free valence) or a divalent group (two free valences) or higher, and desirably a monovalent group (however, at this time, the free valence is counted except for a moiety that is bonded to the above substituent). The number of the naphthalene ring is preferably 1 to 3.

As the cation moiety of the onium salts having a naphthalene ring on the cation moiety, a structure represented by the following formula (a5) is preferable.

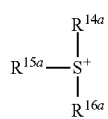
(a5)

In the formula (a5), at least one of $R^{14a}$, $R^{15a}$, and $R^{16a}$ represent a group represented by the following formula (a6), the others represent a linear or branched alkyl group having 1 to 6 carbon atoms, a phenyl group which may have a substituent, a hydroxyl group, or a linear or branched alkoxy group having 1 to 6 carbon atoms. Alternatively, one of $R^{14a}$, $R^{15a}$, and $R^{16a}$ may be a group represented by the following formula (a6), the other two each independently may be a linear or branched alkylene group having 1 to 6 carbon atoms, and the terminals thereof may be bonded to each other to form a ring.

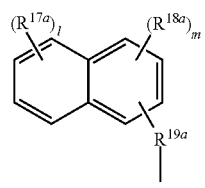
(a6)

In the formula (a6), $R^{17a}$ and $R^{18a}$ each independently represent a hydroxyl group, a linear or branched alkoxy group having 1 to 6 carbon atoms, or a linear or branched alkyl group having 1 to 6 carbon atoms, $R^{19a}$ represents a single bond or a linear or branched alkylene group having 1 to 6 carbon atoms which may have a substituent. l and m each independently represent an integer of 0 to 2, and l+m is 3 or less. However, in a case where a plurality of $R^{17a}$'s exist, the plurality of $R^{17a}$'s may be the same as or different from each other. In addition, in a case where a plurality of $R^{18a}$'s exist, the plurality of $R^{18a}$'s may be the same as or different from each other.

Among $R^{14a}$, $R^{15a}$, and $R^{16a}$, the number of the group represented by the formula (a6) is preferably 1, from a viewpoint of stability of the compound, the others may be a linear or branched alkylene group having 1 to 6 carbon atoms, and the terminals thereof may be bonded to each other to form a ring. In this case, the above two alkylene groups constitute a 3- to 9-membered ring including a sulfur atom. The number of the atom (including a sulfur atom) constituting the ring is preferably 5 or 6.

In addition, examples of the substituent which the alkylene group may have include an oxygen atom (in this case, a carbonyl group is formed by the oxygen atom and a carbon atom constituting an alkylene group) and a hydroxyl group.

In addition, examples of the substituent which a phenyl group may have include a hydroxyl group, a linear or branched alkoxy group having 1 to 6 carbon atoms, and a linear or branched alkyl group having 1 to 6 carbon atoms.

Preferred examples of the cation moiety of the substituents include structures represented by the following Formulae (a7) and (a8), and a structure represented by the following Formula (a8) is particularly preferable.

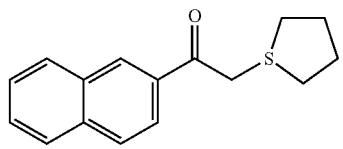
(a7)

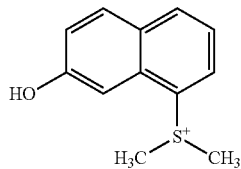
(a8)

The cation moiety may be a iodonium salt or a sulfonium salt, and is desirably a sulfonium salt from a viewpoint of efficiency of acid generation.

Accordingly, as a preferred anion moiety of the onium salt having a naphthalene ring on a cation moiety, an anion which can form the sulfonium salt is desirable.

As the anion moiety of the acid generator, a fluoroalkylsulfonic acid ion or aryl sulfonic acid ion in which all or a part of hydrogen atoms are fluorinated can be exemplified.

The alkyl group in the fluoroalkylsulfonic acid ion may be linear, branched, or cyclic and have 1 to 20 carbon atoms. Preferably, the number of carbon atoms is 1 to 10 from a viewpoint of bulkiness and diffusion length of the generated acid. In particular, branched or cyclic groups are preferable since they have shorter diffusion length. Also, a methyl group, an ethyl group, a propyl group, a butyl group, and an octyl group may be preferably exemplified since they can be synthesized inexpensively.

The aryl group in the aryl sulfonic acid ion may be an aryl group having 6 to 20 carbon atoms, and examples thereof include a phenyl group and a naphthyl group, which may be substituted or unsubstituted with an alkyl group or a halogen atom. In particular, aryl groups having 6 to 10 carbon atoms are preferable since they can be synthesized inexpensively. Preferable examples of the aryl group include a phenyl group, a toluenesulfonyl group, an ethylphenyl group, a naphthyl group, and a methylnaphthyl group.

In the case where all or a part of hydrogen atoms in the fluoroalkylsulfonic acid ion or the aryl sulfonic acid ion are fluorinated, the fluorination ratio is preferably 10% to 100%, and more preferably 50% to 100%. It is particularly preferable that all hydrogen atoms is each substituted with a fluorine atom since acid strength becomes greater. Examples thereof include trifluoromethane sulfonate, perfluorobutane sulfonate, perfluorooctane sulfonate, and perfluorobenzene sulfonate.

Among these, as the preferred anion moiety, a structure represented by the following formula (a9) can be exemplified.

   (a9)

In the formula (a9), $R^{20a}$ is a group represented by the following formula (a10) or (a11), or a group represented by the following Formula (a12).

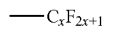   (a10)

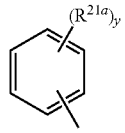   (a11)

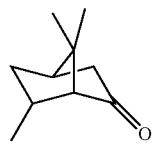   (a12)

In the formula (a10), x represents an integer of 1 to 4. In addition, in the formula (a11), $R^{21a}$ represents a hydrogen atom, a hydroxyl group, a linear or branched alkyl group having 1 to 6 carbon atoms, or a linear or branched alkoxy group having 1 to 6 carbon atoms, and y represents an integer of 1 to 3. Among these, trifluoromethane sulfonate or perfluorobutane sulfonate is preferable from a viewpoint of safety.

In addition, as the anion moiety, structures containing nitrogen represented by the following formulae (a13) and (a14) can be used.

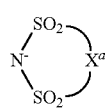   (a13)

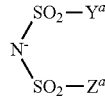   (a14)

In the formulae (a13) and (a14), $X^a$ represents a linear or branched alkylene group in which at least one hydrogen atom is substituted with a fluorine atom, and the carbon number of the alkylene group is 2 to 6, preferably 3 to 5, and most preferably 3. In addition, $Y^a$ and $Z^a$ each independently represent a linear or branched alkyl group in which at least one hydrogen atom is substituted with a fluorine atom, and the carbon number of the alkyl group is 1 to 10, preferably 1 to 7, and more preferably 1 to 3.

As the carbon number of the alkylene group of $X^a$, or the carbon number of the alkyl group of $Y^a$ and $Z^a$ is smaller, solubility in the organic solvent becomes more excellent, which is preferable.

In addition, in the alkylene group of $X^a$ or in the alkyl group of $Y^a$ and $Z^a$, as the number of the hydrogen atom which has been substituted with a fluorine atom is greater, the acid strength becomes greater, which is preferable. A ratio of the fluorine atom in the alkylene group or the alkyl group, in other words, a fluorination ratio is preferably 70% to 100%, more preferably 90% to 100%, and most preferably a perfluoroalkylene group or a perfluoroalkyl group in which all hydrogen atoms are substituted with fluorine atoms.

Preferred examples of the onium salts having a naphthalene ring on a cation moiety include compounds represented by the following Formulae (a15) and (a16).

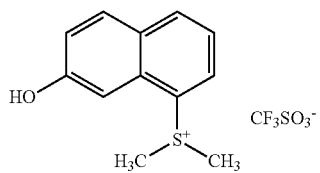   (a15)

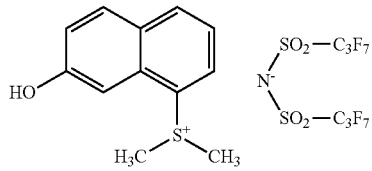   (a16)

In addition, examples of the fifth aspect of the acid generator (A) include bissulfonyldiazomethanes such as bis(p-toluenesulfonyl)diazomethane, bis(1,1-dimethyl ethylsulfonyl)diazomethane, bis(cyclohexylsulfonyl)diazomethane, and bis(2,4-dimethylphenylsulfonyl)diazomethane; nitrobenzyl derivatives such as 2-nitrobenzyl p-toluenesulfonate, 2,6-dinitrobenzyl p-toluenesulfonate, nitrobenzyl tosylate, dinitrobenzyl tosylate, nitrobenzyl sulfonate, nitrobenzyl carbonate, and dinitrobenzyl carbonate; sulfonates such as pyrogalloltrimesylate, pyrogalloltritosylate, benzyltosylate, benzylsulfonate, N-methylsulfonyloxysuccinimide, N-trichloromethylsulfonyloxysuccinimide, N-phenylsulfonyloxymaleimide, and N-methylsulfonyloxyphthalimide; trifluoromethane sulfonates such as N-hydroxyphthalimide and N-hydroxynaphthalimide; onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl)diphenylsulfonium trifluoromethanesulfonate, and (p-tert-butylphenyl)diphenylsulfonium trifluoromethanesulfonate; benzointosylates such as benzointosylate and α-methylbenzointosylate; and other diphenyliodonium salts, triphenylsulfonium salts, phenyldiazonium salts, and benzylcarbonates.

The acid generator (A) may also be the following acid generator according to the sixth aspect, which is represented by the following formulae (ii) and (iii).

A compound (U.S. Pat. No. 6,004,724) represented by:

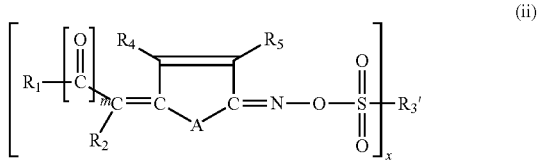   (ii)

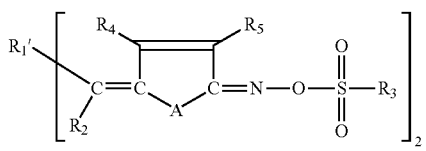

(In the formulae, m represents 0 or 1; X represents 1 or 2; $R_1$ represents a phenyl group in which at least one alkyl group having 1 to 12 carbon atoms may be substituted, a heteroaryl group, or the like, or in a case where m is 0, $R_1$ further represents an alkoxycarbonyl group having 2 to 6 carbon atoms, a phenoxycarbonyl group, CN, or the like; $R_1{}'$ represents an alkylene group having 2 to 12 carbon atoms or the like; $R_2$ represents a phenyl group in which at least one alkyl group having 1 to 12 carbon atoms may be substituted, a heteroaryl group, or the like, or in a case where m is 0, $R_2$ further represents an alkoxycarbonyl group having 2 to 6 carbon atoms, a phenoxycarbonyl group, CN, or the like; $R_3$ represents an alkyl group having 1 to 18 carbon atoms or the like; $R_3{}'$ represents an alkyl group having 1 to 18 carbon atoms or the like, when X is 1, and an alkylene group having 2 to 12 carbon atoms, a phenylene group, or the like, when X is 2; $R_4$ and $R_5$ independently represent a hydrogen atom, halogen, an alkyl group having 1 to 6 carbon atoms, or the like; A represents S, O, $NR_6$, or the like; and $R_6$ represents a hydrogen atom, a phenyl group, or the like.). Specifically, thiolene-containing oxime sulfonate represented by the following formula can be exemplified.

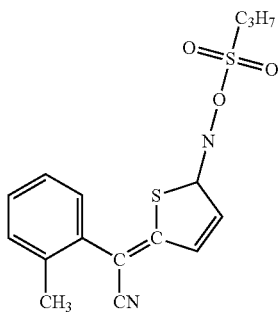

The examples mentioned in the third aspect are preferable as the acid generator (A1), and among these, the examples mentioned as preferable in the third aspect are preferable as the acid generator (A1).

The acid generator (A1) may be used alone or two or more thereof may be used in combination.

In the present invention, in a case where a total of the solid content of a resin (B) in the photosensitive resin composition described below, and the solid content of an alkali-soluble resin (C) which is used depending on desire is set to 100 parts by mass, the content of the acid generator (A1) is preferably 0.1 parts by mass to 10 parts by mass, more preferably 0.5 parts by mass to 5 parts by mass, and still more preferably 1 part by mass to 4 parts by mass.

If the use amount of the acid generator (A1) is within the aforementioned range, it is easy to prepare the photosensitive resin composition having excellent sensitivity and excellent storage stability as a uniform solution.

In addition, in the present invention, the acid generator (A1) may be combined with the acid generator (A) other than the acid generator (A1) and used, but even if the only acid generator (A1) is used as the acid generator, the purpose of the present invention can be sufficiently achieved.

Resin (B)

The resin (B) whose solubility in alkali increases under the action of an acid (in the specification, may be simply referred to as "resin (B)") is not particularly limited, and arbitrary resins whose solubility in alkali increases under the action of an acid can be used. Among these, it is preferable to contain at least one resin selected from the group consisting of a novolac resin (B1), a polyhydroxystyrene resin (B2), a novolac-polyhydroxystyrene crosslinked resin (B3), and an acrylic resin (B4).

Novolac Resin (B1)

A novolac resin (B1) whose solubility in alkali increases under the action of an acid can be synthesized by an addition reaction between a novolac resin (C1) and a compound corresponding to an acid-dissociative dissolution-controlling group.

The aforementioned novolac resin (C1) is not particularly limited, and the resin can be arbitrarily selected from substances which can be commonly used as a film forming substance in a positive-type photoresist composition. Preferably, a novolac resin obtained by a condensation reaction between an aromatic hydroxy compound and aldehydes or ketones can be exemplified.

Examples of the aromatic hydroxy compound used in the synthesis of the novolac resin (C1) include phenol; cresols such as m-cresol, p-cresol, and o-cresol; xylenols such as 2,3-xylenol, 2,5-xylenol, 3,5-xylenol, and 3,4-xylenol; alkylphenols such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, and 2-tert-butyl-5-methylphenol; alkoxyphenols such as p-methoxyphenol, m-methoxyphenol, p-ethoxyphenol, m-ethoxyphenol, p-propoxyphenol, and m-propoxyphenol; isopropenylphenols such as o-isopropenylphenol, p-isopropenylphenol, 2-methyl-4-isopropenylphenol, and 2-ethyl-4-isopropenylphenol; arylphenols such as phenylphenol; and polyhydroxy phenols such as 4,4'-dihydroxybiphenyl, bisphenol A, resorcinol, hydroquinone, and pyrogallol. These may be used alone or two or more thereof may be used in combination.

Examples of the aldehyde used in the synthesis of the novolac resin (C1) include formaldehyde, paraformaldehyde, trioxane, acetaldehyde, propionaldehyde, butylaldehyde, trimethylacetaldehyde, acrolein, crotonaldehyde, cyclohexane aldehyde, furfural, furylacrolein, benzaldehyde, terephthalaldehyde, phenylacetaldehyde, α-phenylpropyl aldehyde, β-phenylpropyl aldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, and cinnamic acid aldehyde. These may be used alone or two or more thereof may be used in combination.

Among these aldehydes, formaldehyde is preferable from a viewpoint of easy availability, but in order to enhance heat resistance, a combination of hydroxybenzaldehydes and formaldehyde is particularly preferably used.

Examples of ketone used in the synthesis of the novolac resin (C1) include acetone, methylethylketone, diethylketone, and diphenylketone. These may be used alone or two or more thereof may be used in combination. Furthermore, the aldehydes and ketones may be used by appropriately being combined with each other.

The novolac resin (C1) can be produced by the condensation reaction between the aromatic hydroxy compound and the aldehydes or ketones in the presence of an acid catalyst by means of the well-known method. At this time, as the acid catalyst, hydrochloric acid, sulfuric acid, formic acid, oxalic acid, or paratoluene sulfonic acid can be used.

Preferable range of the mass average molecular weight (Mw) of the novolac resin (C1) according to the embodiment, in terms of the polystyrene before being protected by the acid-dissociative dissolution-controlling group, is preferably 1,000 to 100,000, more preferably 2,000 to 50,000, and still more preferably 3,000 to 30,000. If the Mw is smaller than the aforementioned range, coating properties may be deteriorated, and if the Mw is greater than the aforementioned range, resolution is deteriorated.

The novolac resin (B1) whose solubility in alkali increases under the action of an acid is protected by a group, which is changed to be alkali-soluble by decomposition caused by an acid catalyst reaction of at least part of all phenolic hydroxyl groups in the novolac resin (C1), so-called an acid-dissociative dissolution-controlling group, and becomes sparingly soluble or insoluble in alkali due to the above.

As the acid-dissociative dissolution-controlling group, a group which is dissociated by the acid generated from the aforementioned acid generator (A) is preferable.

Examples of a first aspect of the acid-dissociative dissolution-controlling group include an alkoxyalkyl group such as a 1-ethoxymethyl group, a 1-ethoxyethyl group, a 1-propoxymethyl group, a 1-propoxyethyl group, a 1-n-butoxymethyl group, a 1-iso-butoxymethyl group, and a 1-tert-butoxymethyl group; an alkoxycarbonylalkyl group such as a t-butoxycarbonyl group, a t-butoxycarbonylmethyl group, and a t-butoxycarbonylethyl group; a tetrahydrofuranyl group; a tetrahydropyranyl group; a linear or branched acetal group; a cyclic acetal group; and a trialkylsilyl group such as a trimethylsilyl group, a triethylsilyl group, and a triphenylsilyl group.

Among these, an ethylvinyl group (ethoxyethyl group) represented by the following Chemical Formula (b1) or a t-butoxycarbonyl group represented by the following Chemical Formula (b2) is preferable in order to obtain a photoresist composition having excellent resolution, and an ethylvinyl group is particularly preferable.

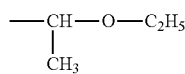
(b1)

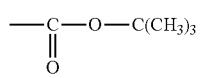
(b2)

In the novolac resin (B1) whose solubility in alkali increases under the action of an acid, the ratio (protection ratio) of the phenolic hydroxyl group which is protected by the acid-dissociative dissolution-controlling group is preferably about 10 mol % to 50 mol %, with respect to all the phenolic hydroxyl groups in the novolac resin (C1).

As a second aspect of the acid-dissociative dissolution-controlling group, the novolac resin (B1) may be sparingly soluble or insoluble in alkali by reacting a crosslinking agent (hereinafter, may be referred to as a "crosslinking agent (b3)") represented by the following formula (b3) with at least part of all the phenolic hydroxyl groups in the novolac resin (C1).

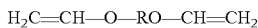
(b3)

In the crosslinking agent (b3), $R^1$ represents a branched, linear, or cyclic alkylene group having 1 to 10 carbon atoms, which may have a substituent, or a structure represented by the following formula (b4). In addition, the alkylene group may include an oxygen bond (ether bond) on a main chain.

(b4)

(In the formula, $R^4$ represents an alkylene group having 1 to 10 carbon atoms, which may have a substituent, and m represents 0 or 1.)

In the formula (b4), $R^4$ also represents a branched, linear, or cyclic alkylene group having 1 to 10 carbon atoms, which may have a substituent, and the alkylene group may include an oxygen bond (ether bond) on a main chain. As $R^1$, structures represented by $—C_4H_8—$, $—C_2H_4OC_2H_4—$, $—C_2H_4OC_2H_4OC_2H_4—$, and the formula (b4) are preferable, among these, a structure represented by the formula (b4) is preferable, and a structure in which the carbon number of $R^4$ is 1, and m is 1, is particularly preferable.

The crosslinking agent (b3) is used in a ratio of 3 mass % to 15 mass % and preferably in a ratio of 4 mass % to 8 mass %, with respect to the solid content of the novolac resin (C1). If the crosslinking agent is used in a ratio of less than 3 mass %, there is a tendency that a film thickness of an unexposed area of the resist pattern is greatly reduced, and a contrast of the resist pattern is deteriorated. If the crosslinking agent is used in a ratio of more than 15 mass %, there is a tendency that solubility in a developing solution (alkali aqueous solution) is remarkably deteriorated, and there is a concern that the sensitivity may be deteriorated and the pattern may not be resolved.

The mass average molecular weight is preferably 10,000 to 70,000, and particularly preferably 20,000 to 50,000, after the crosslinking agent (b3) and the novolac resin (C1) are reacted with each other.

As a third aspect of the acid-dissociative dissolution-controlling group, the novolac resin (B1) may be sparingly soluble or insoluble in alkali by reacting both the first aspect of the acid-dissociative dissolution-controlling group and the second aspect of the crosslinking agent (b3) with at least part of all the phenolic hydroxyl groups in the novolac resin (C1).

In the aspect, with respect to all the phenolic hydroxyl groups in the novolac resin (C1), the ratio (protection ratio) of the phenolic hydroxyl group protected by the first aspect of the acid-dissociative dissolution-controlling group is preferably about 3 mol % to 40 mol %, and particularly preferably 5 mol % to 30 mol %. The co-existing second aspect of the crosslinking agent (b3) is preferably used in a ratio of 1 mass % to 15 mass % and preferably 2 mass % to 8 mass %, with respect to the solid content of the novolac resin (C1).

Polyhydroxystyrene Resin (B2)

The polyhydroxystyrene resin (B2) whose solubility in alkali increases under the action of an acid can be synthesized by an addition reaction between a polyhydroxystyrene resin (C2) and a compound corresponding to the acid-dissociative dissolution-controlling group.

The polyhydroxystyrene resin is generally used for a resist composition, and is not particularly limited if the resin includes a hydroxystyrene structural unit. Examples thereof include a homopolymer of hydroxystyrene, a copolymer of hydroxystyrene and other hydroxystyrene-based monomers or styrene-based monomers, and a copolymer of hydroxystyrene and acrylic acid or methacrylic acid or derivatives thereof.

In the polyhydroxystyrene resin, the hydroxystyrene-based structural unit is preferably included in an amount of at least 50 mol % or more and preferably 70 mol % or more, from a viewpoint of addition reactivity of the acid-dissociative dissolution-controlling group.

Among these, a copolymer including a hydroxystyrene-based structural unit and at least a styrene-based structural unit other than that is preferable, from a viewpoint of obtaining the resist composition having high heat resistance and high sensitivity.

The polyhydroxystyrene resin (B2) whose solubility in alkali increases under the action of an acid is a resin in which at least part of all phenolic hydroxyl groups in the polyhydroxystyrene resin (C2) is protected by a group which becomes alkali-soluble by decomposition caused by an acid catalyst reaction, so-called an acid-dissociative dissolution-controlling group, thereby becoming sparingly soluble or insoluble in alkali.

As the acid-dissociative dissolution-controlling group, a group which is dissociated by the acid generated from the aforementioned acid generator (A) may be used.

Examples of a first aspect of the acid-dissociative dissolution-controlling group include an alkoxyalkyl group such as a 1-ethoxymethyl group, a 1-ethoxyethyl group, a 1-propoxymethyl group, a 1-propoxyethyl group, a 1-n-butoxymethyl group, a 1-iso-butoxymethyl group, and a 1-tert-butoxymethyl group; an alkoxycarbonylalkyl group such as a t-butoxycarbonyl group, a t-butoxycarbonylmethyl group, and a t-butoxycarbonylethyl group; a tetrahydrofuranyl group; a tetrahydropyranyl group; a linear or branched acetal group; a cyclic acetal group; and a trialkylsilyl group such as a trimethylsilyl group, a triethylsilyl group, and a triphenylsilyl group.

Among these, an ethylvinyl group (ethoxyethyl group) represented by Chemical Formula (b1) and a t-butoxycarbonyl group represented by Chemical Formula (b2) is preferable in order to obtain a photoresist composition having excellent resolution, and an ethylvinyl group is particularly preferable.

In the polyhydroxystyrene resin (B2) whose solubility in alkali increases under the action of an acid, the ratio (protection ratio) of the phenolic hydroxyl group which is protected by the acid-dissociative dissolution-controlling group is preferably about 10 mol % to 50 mol %, with respect to all the phenolic hydroxyl groups in the polyhydroxy styrene resin (C2).

As a second aspect of the acid-dissociative dissolution-controlling group, the hydroxystyrene resin (B2) may be sparingly soluble or insoluble in alkali by reacting the crosslinking agent represented by the formula (b3) with at least part of all the phenolic hydroxyl groups in the polyhydroxystyrene resin (C2).

The crosslinking agent (b3) is used in a ratio of 2 mass % to 15 mass % and preferably 3 mass % to 8 mass %, with respect to the solid content of the hydroxystyrene resin (C2). If the crosslinking agent is used in a ratio of less than 2 mass %, there is a tendency that a contrast of the resist pattern is deteriorated. If the crosslinking agent is used in a ratio of more than 15 mass %, there is a tendency that solubility in a solvent is remarkably deteriorated and solubility in a developing solution (alkali aqueous solution) is remarkably deteriorated, and there is a concern that the sensitivity may be deteriorated and the pattern may not be resolved.

The mass average molecular weight is preferably 50,000 to 150,000 and particularly preferably 60,000 to 100,000, after the crosslinking agent (b3) and the hydroxystyrene resin (C2) are reacted with each other.

As a third aspect of the acid-dissociative dissolution-controlling group, the hydroxystyrene resin (B2) may be sparingly soluble or insoluble in alkali by reacting both the first aspect of the acid-dissociative dissolution-controlling group and the second aspect of the crosslinking agent (b3) with at least part of all the phenolic hydroxyl groups in the hydroxystyrene resin (C2).

In the aspect, with respect to all the phenolic hydroxyl groups in the hydroxystyrene resin (C2), the ratio (protection ratio) of the phenolic hydroxyl group protected by the first aspect of the acid-dissociative dissolution-controlling group is preferably about 3 mol % to 40 mol %, and particularly preferably 5 mol % to 30 mol %. The co-existing second aspect of the crosslinking agent (b3) is preferably used in a ratio of 1 mass % to 15 mass % and preferably 2 mass % to 7 mass %, with respect to the solid content of the hydroxystyrene resin (C2).

Novolac-Polyhydroxystyrene Crosslinked Resin (B3)

The novolac-polyhydroxystyrene crosslinked resin (B3) whose solubility in alkali increases under the action of an acid can be synthesized by addition reaction of the aforementioned crosslinking agent (b3) as the compound corresponding to the acid-dissociative dissolution-controlling group under the coexistence of the aforementioned novolac resin (C1) and polyhydroxystyrene resin (C2).

As the resin (B3) of the present aspect, the novolac-hydroxystyrene crosslinked resin (B3) may be sparingly soluble or insoluble in alkali by reacting the crosslinking agent represented by the formula (b3) with at least part of all phenolic hydroxyl groups in a mixed resin (C3) in which the novolac resin (C1) and the polyhydroxystyrene resin (C2) coexist.

The crosslinking agent (b3) is used in a ratio of 2 mass % to 15 mass % and preferably 3 mass % to 8 mass %, with respect to the solid content of the mixed resin (C3). If the crosslinking agent is used in a ratio of less than 2 mass %, there is a tendency that a contrast of the resist pattern is deteriorated. If the crosslinking agent is used in a ratio of more than 15 mass %, there is a tendency that solubility in a solvent is remarkably deteriorated and solubility in a developing solution (alkali aqueous solution) is remarkably deteriorated, and there is a concern that the sensitivity may be deteriorated and the pattern may not be resolved.

The mass average molecular weight is preferably 50,000 to 200,000 and particularly preferably 60,000 to 100,000, after the crosslinking agent (b3) and the mixed resin (C3) are reacted with each other.

The crosslinking agent (b3) may be introduced by being combined with the aforementioned other acid-dissociative dissolution-controlling groups, and examples thereof include an alkoxyalkyl group such as a 1-ethoxymethyl group, a 1-ethoxyethyl group, a 1-propoxymethyl group, a 1-propoxyethyl group, a 1-n-butoxymethyl group, a 1-iso-butoxymethyl group, and a 1-tert-butoxymethyl group; an alkoxycarbonylalkyl group such as a t-butoxycarbonyl group, a t-butoxycarbonylmethyl group, and a t-butoxycarbonylethyl group; a tetrahydrofuranyl group; a tetrahydropyranyl group; a linear or branched acetal group; a cyclic acetal group; and a trialkylsilyl group such as a trimethylsilyl group, a triethylsilyl group, and a triphenylsilyl group.

Among these, an ethylvinyl group (ethoxyethyl group) represented by Chemical Formula (b1) and a t-butoxycarbonyl group represented by Chemical Formula (b2) is preferable in order to obtain a photoresist composition having excellent resolution, and an ethylvinyl group is particularly preferable.

In the present aspect, with respect to all the phenolic hydroxyl groups in the mixed resin (C3), the crosslinking agent (b3) is used in a ratio of 1 mass % to 15 mass % and preferably 2 mass % to 7 mass %, with respect to the solid content of the mixed resin (C3), and the ratio (protection ratio) of the phenolic hydroxyl group protected by the aforementioned other acid-dissociative dissolution-controlling groups is preferably about 3 mol % to 40 mol % and particularly preferably 8 mol % to 35 mol %.

Acrylic Resin (B4)

As the acrylic resin (B4), a resin including structural units represented by the following formulae (b5) to (b7) can be used.

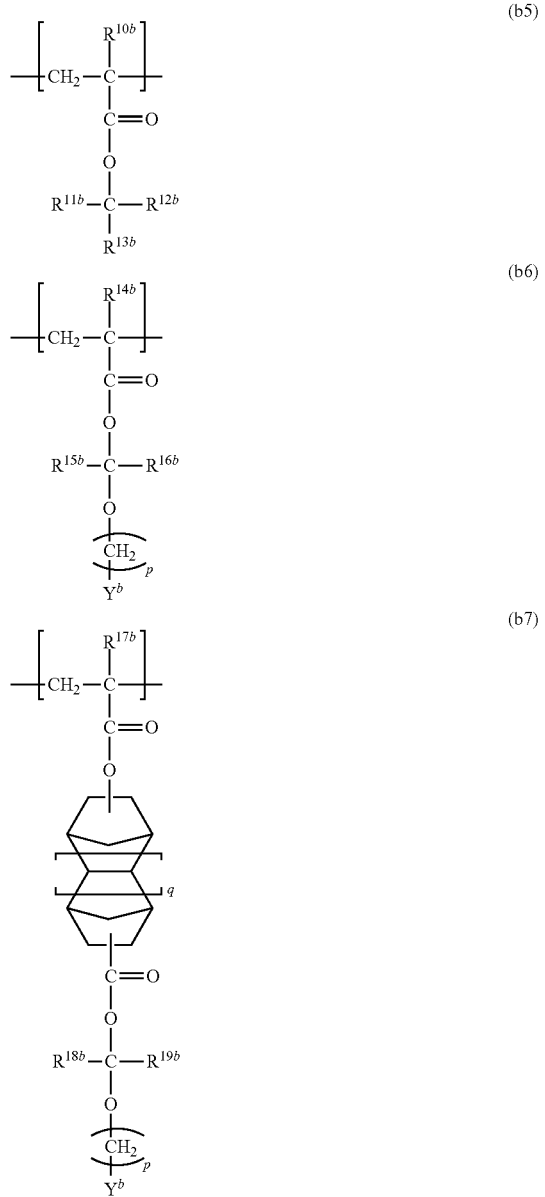

In Formulae (b5) to (b7), $R^{10b}$ and $R^{14b}$ to $R^{19b}$ each independently represent a hydrogen atom, a linear or branched alkyl group having 1 to 6 carbon atoms, a fluorine atom, or a linear or branched fluorinated alkyl group having 1 to 6 carbon atoms, $R^{11b}$ to $R^{13b}$ each independently represent a linear or branched alkyl group having 1 to 6 carbon atoms or a linear or branched fluorinated alkyl group having 1 to 6 carbon atoms, $R^{12b}$ and $R^{13b}$ may be bonded to each other to form a hydrocarbon ring having 5 to 20 carbon atoms with a carbon atom to which $R^{12b}$ and $R^{13b}$ are bonded, $Y^b$ represents an aliphatic cyclic group which may have a substituent or an alkyl group, p represents an integer of 0 to 4, and q represents 0 or 1.

In addition, examples of the aforementioned linear or branched alkyl group include a methyl group, an ethyl group, a propyl group, an isopropyl group, a n-butyl group, an isobutyl group, a tert-butyl group, a pentyl group, an isopentyl group, and a neopentyl group. In addition, the fluorinated alkyl group is a group in which all or a part of hydrogen atoms of the aforementioned alkyl group are substituted with a fluorine atom.

In a case where $R^{12b}$ and $R^{13b}$ are bonded to each other but a hydrocarbon ring is not formed, $R^{11b}$, $R^{12b}$, and $R^{13b}$ preferably represent a linear or branched alkyl group having 2 to 4 carbon atoms, from a viewpoint of obtaining high contrast and excellent resolution and depth and width of focus.

$R^{12b}$ and $R^{13b}$ may form an aliphatic cyclic group having 5 to 20 carbon atoms with a carbon atom to which $R^{12b}$ and $R^{13b}$ are bonded. Examples of the aliphatic cyclic group include groups in which at least one hydrogen atom is removed from polycycloalkanes such as monocycloalkanes, bicycloalkanes, tricycloalkanes, and tetracycloalkanes. Examples thereof include monocycloalkanes such as cyclopentane, cyclohexane, cycloheptane, and cyclooctane, and groups in which at least one hydrogen atom is removed from polycycloalkanes such as adamantane, norbornane, isobornane, tricyclodecane, and tetracyclododecane. A group in which at least one hydrogen atom is removed from cyclohexane or adamantane (further may have a substituent) is particularly preferable.

Further, in a case where the aliphatic cyclic group formed by $R^{12b}$ and $R^{13b}$ has a substituent on a ring skeleton, examples of the substituent include a polar group such as a hydroxyl group, a carboxy group, a cyano group, and an oxygen atom (=O), and a linear or branched alkyl group having 1 to 4 carbon atoms. As the polar group, an oxygen atom (=O) is particularly preferable.

$Y^b$ represents an aliphatic cyclic group or an alkyl group, and examples thereof include groups in which at least one hydrogen atom is removed from polycycloalkanes such as monocycloalkanes, bicycloalkanes, tricycloalkanes, and tetracycloalkanes. Examples thereof include monocycloalkanes such as cyclopentane, cyclohexane, cycloheptane, and cyclooctane and groups in which at least one hydrogen atom is removed from polycycloalkanes such as adamantane, norbornane, isobornane, tricyclodecane, and tetracyclododecane. A group in which at least one hydrogen atom is removed from adamantane (further may have a substituent) is particularly preferable.

Further, in a case where the aforementioned aliphatic cyclic group of $Y^b$ has a substituent on a ring skeleton, examples of the substituent include a polar group such as a hydroxyl group, a carboxy group, a cyano group, and an oxygen atom (=O), and a linear or branched alkyl group having 1 to 4 carbon atoms. As the polar group, an oxygen atom (=O) is particularly preferable.

In addition, in a case where $Y^b$ is an alkyl group, a linear or branched alkyl group having 1 to 20 carbon atoms and preferably having 6 to 15 carbon atoms is preferable. As the alkyl group, an alkoxyalkyl group is particularly preferable and examples of the alkoxyalkyl group include a 1-methoxyethyl group, a 1-ethoxyethyl group, a 1-n-propoxyethyl group, a 1-isopropoxyethyl group, a 1-n-butoxyethyl group, a 1-isobutoxyethyl group, a 1-tert-butoxyethyl group, a 1-methoxypropyl group, a 1-ethoxypropyl group, a 1-methoxy-1-methyl-ethyl group, and a 1-ethoxy-1-methylethyl group.

Preferred examples of the structural unit represented by the formula (b5) include structural units represented by the following Formulae (b5-1) to (b5-33).

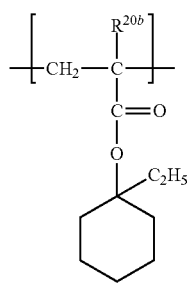
(b5-1)

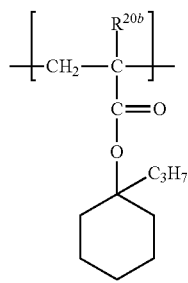
(b5-2)

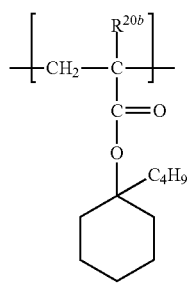
(b5-3)

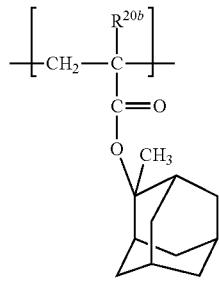
(b5-4)

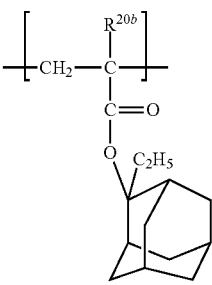
(b5-5)

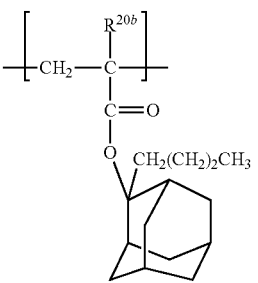
(b5-6)

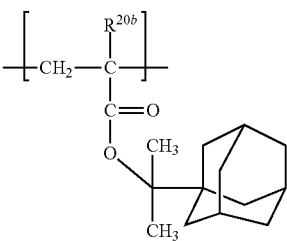
(b5-7)

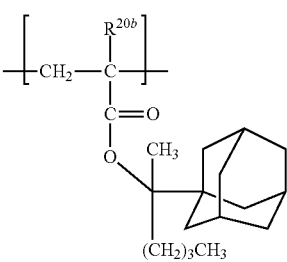
(b5-8)

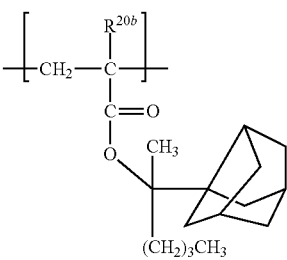
(b5-9)

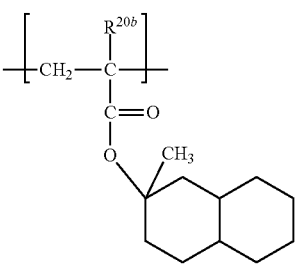
(b5-10)

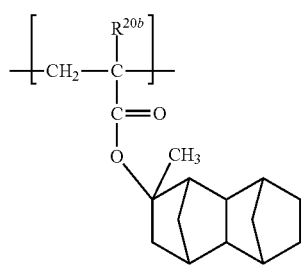

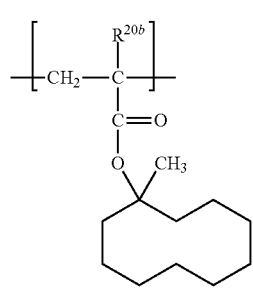
(b5-21)
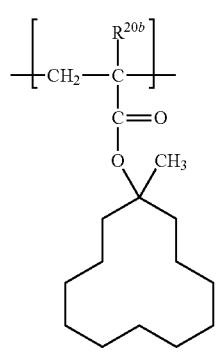
(b5-22)
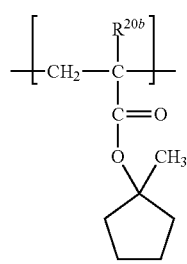
(b5-23)
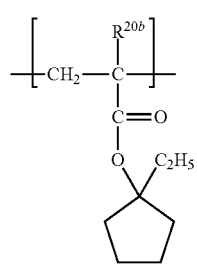
(b5-24)
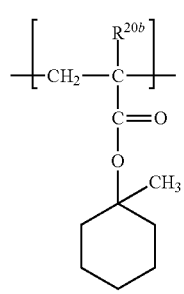
(b5-25)
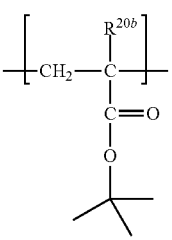
(b5-26)
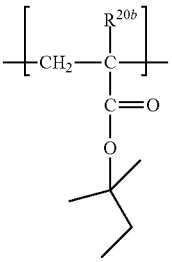
(b5-27)
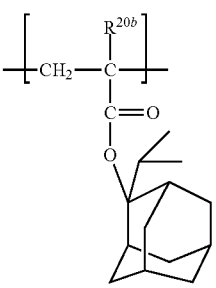
(b5-28)
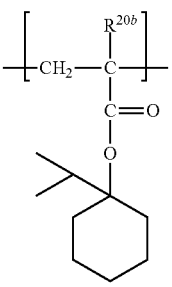
(b5-29)
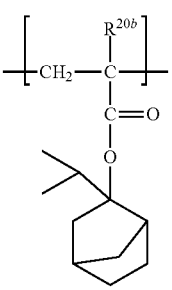
(b5-30)

(b5-31)
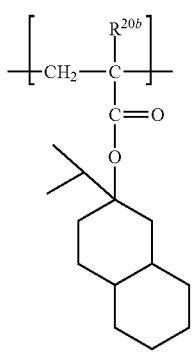
(b5-32)
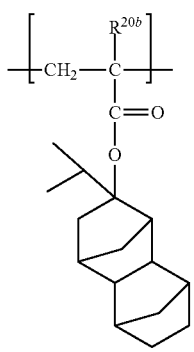
(b5-33)
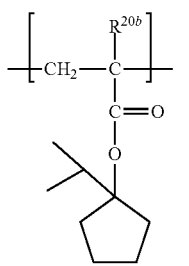
In Formulae (b5-1) to (b5-33), $R^{20b}$ represents a hydrogen atom or a methyl group.
Preferred examples of the structural unit represented by the formula (b6) include structural units represented by the following Formulae (b6-1) to (b6-24).
(b6-1)
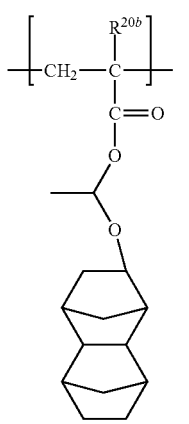
(b6-2)
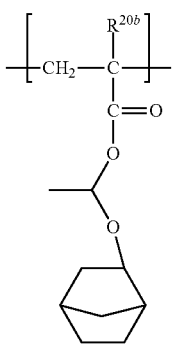
(b6-3)
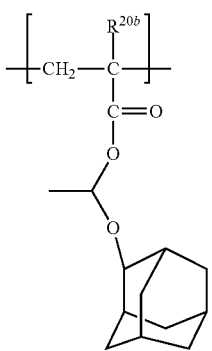
(b6-4)
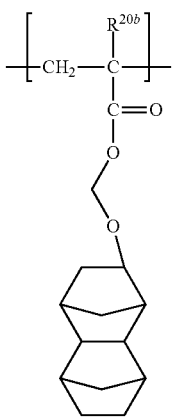
(b6-5)
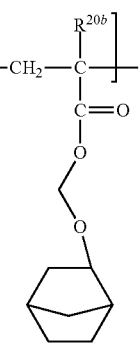

(b6-6)
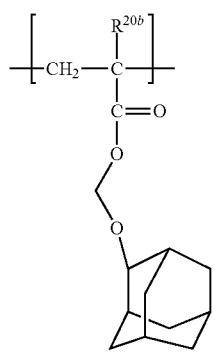
(b6-7)
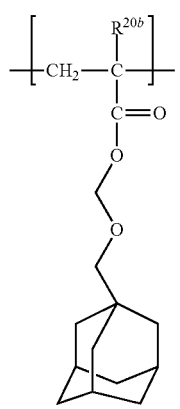
(b6-8)
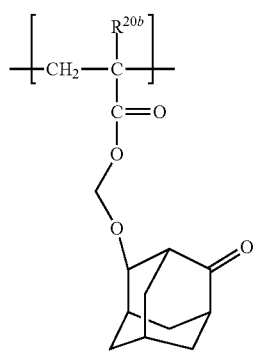
(b6-9)
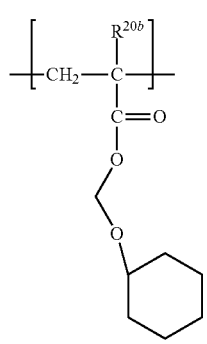
(b6-10)
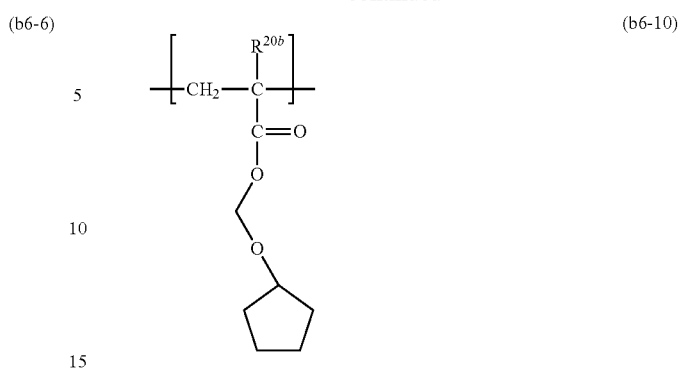
(b6-11)
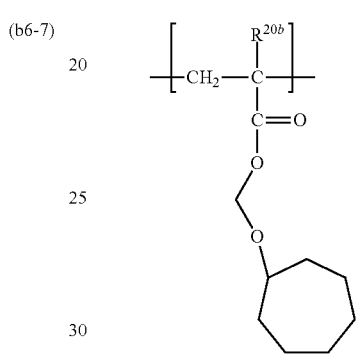
(b6-12)
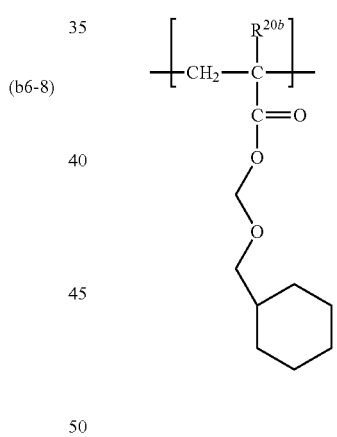
(b6-13)
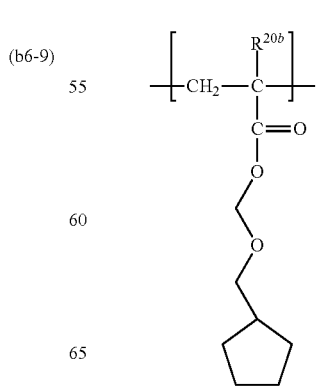

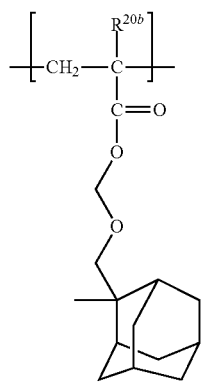
(b6-14)
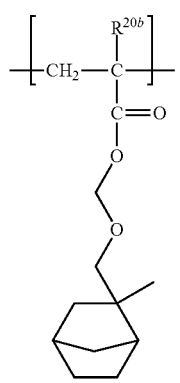
(b6-15)
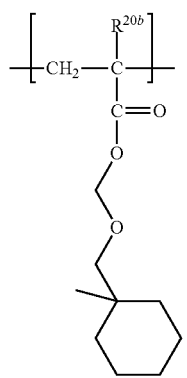
(b6-16)
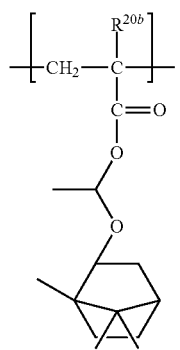
(b6-17)
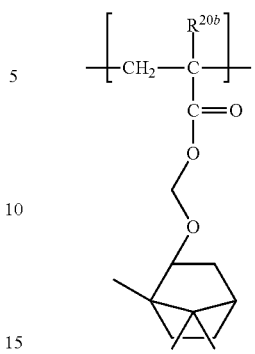
(b6-18)
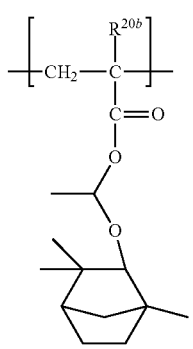
(b6-19)
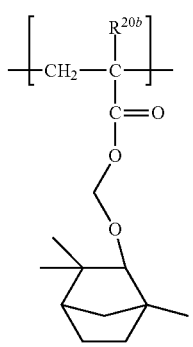
(b6-20)
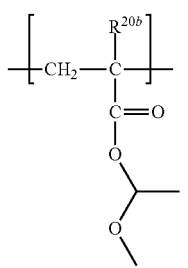
(b6-21)
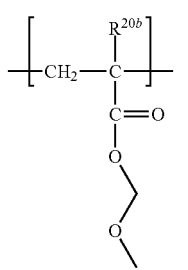
(b6-22)

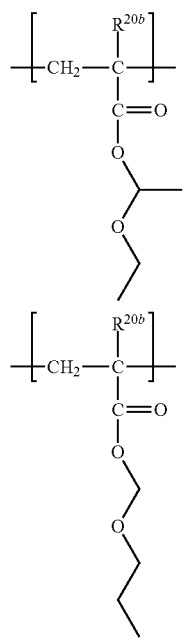
(b6-23)
(b6-24)
In Formulae (b6-1) to (b6-24), $R^{20b}$ represents a hydrogen atom or a methyl group.
Preferred examples of the structural unit represented by the formula (b7) include structural units represented by the following Formulae (b7-1) to (b7-15).
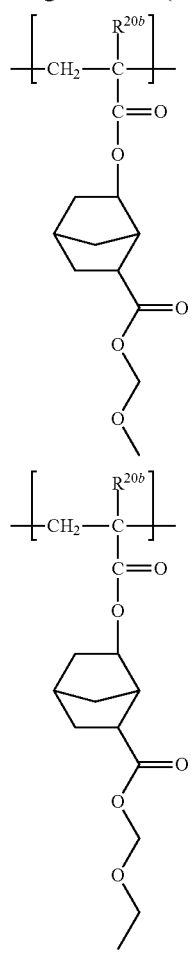
(b7-1)
(b7-2)
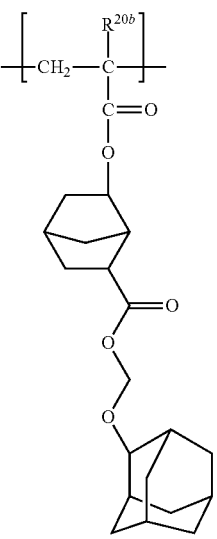
(b7-3)
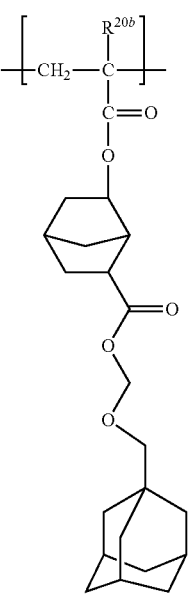
(b7-4)
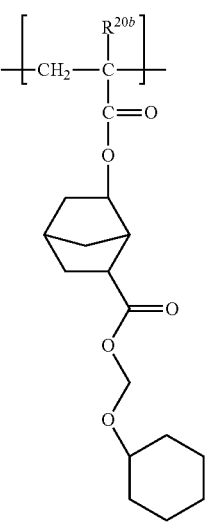
(b7-5)

(b7-6) 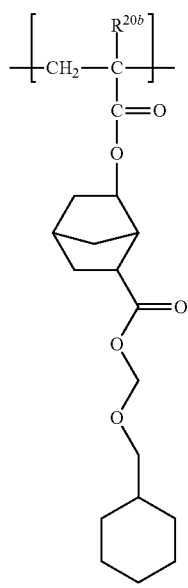
(b7-7) 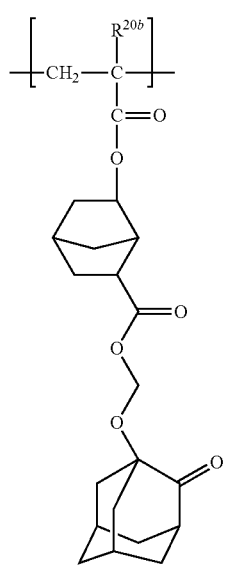
(b7-8) 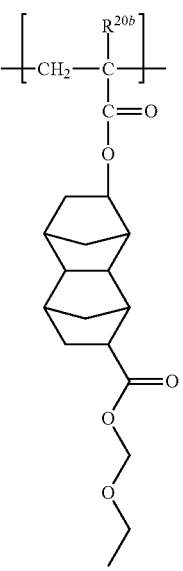
(b7-9) 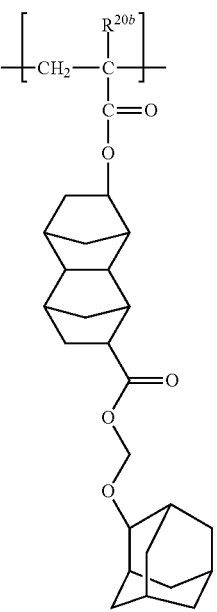

(b7-10)
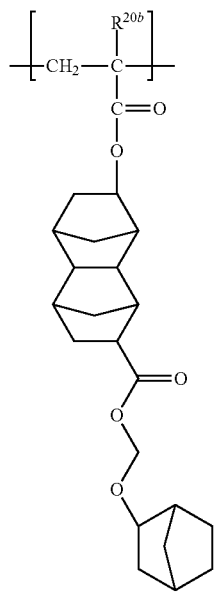
(b7-11)
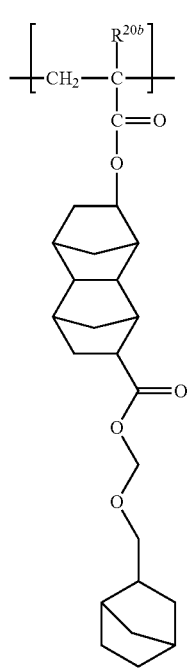
(b7-12)
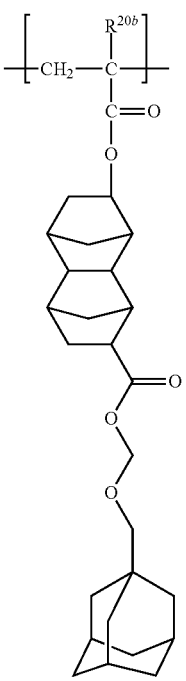
(b7-13)
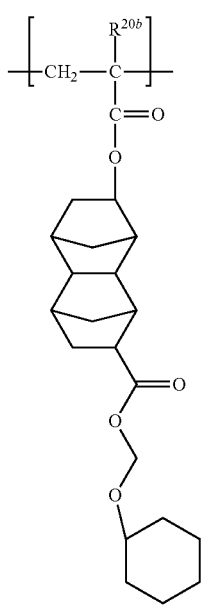

-continued

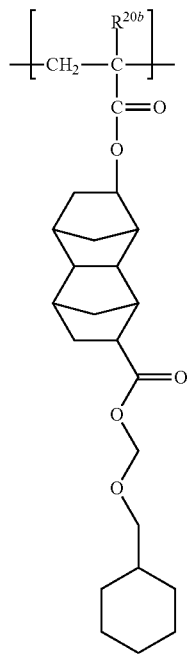

(b7-14)

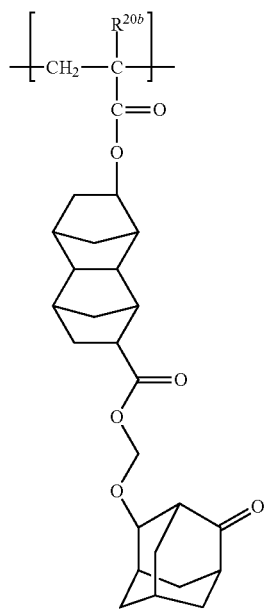

(b7-15)

In Formulae (b7-1) to (b7-15), $R^{20b}$ represents a hydrogen atom or a methyl group.

Further, the acrylic resin (B4) is preferably a resin composed of a copolymer including a structural unit derived from a polymerizable compound having an ether bond in addition to the structural units represented by the formulae (b5) to (b7).

Examples of the polymerizable compound having an ether bond include radically polymerizable compounds such as (meth)acrylic acid derivatives having an ether bond and an ester bond, and examples thereof include 2-methoxyethyl (meth)acrylate, 2-ethoxyethyl(meth)acrylate, methoxytriethylene glycol(meth)acrylate, 3-methoxybutyl(meth)acrylate, ethyl carbitol(meth)acrylate, phenoxy polyethylene glycol(meth)acrylate, methoxypolyethylene glycol(meth)acrylate, methoxypolypropylene glycol(meth)acrylate, and tetrahydrofurfuryl(meth)acrylate. In addition, the polymerizable compound having an ether bond is preferably 2-methoxyethyl(meth)acrylate, 2-ethoxyethyl(meth)acrylate, or methoxytriethylene glycol(meth)acrylate. These polymerizable compounds may be used alone, or two or more thereof may be used in combination.

Further, the acrylic resin (B4) can contain other polymerizable compounds as a structural unit for the purpose of appropriately controlling physical and chemical properties. Examples of the polymerizable compounds include the well-known radically polymerizable compound and an anionically polymerizable compound.

Examples of the polymerizable compound include monocarboxylic acids such as acrylic acid, methacrylic acid, and crotonic acid; dicarboxylic acids such as maleic acid, fumaric acid, and itaconic acid; methacrylic acid derivatives having a carboxyl group and an ester bond, such as 2-methacryloyloxyethyl succinic acid, 2-methacryloyloxyethyl maleic acid, 2-methacryloyloxyethyl phthalic acid, and 2-methacryloyloxyethyl hexahydrophthalic acid; (meth) acrylic acid alkyl esters such as methyl (meth)acrylate, ethyl (meth)acrylate, butyl (meth)acrylate, and cyclohexyl (meth) acrylate; (meth)acrylic acid hydroxyalkyl esters such as 2-hydroxyethyl (meth)acrylate and 2-hydroxypropyl (meth) acrylate; (meth)acrylic acid aryl esters such as phenyl (meth) acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene, and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

In addition, examples of the polymerizable compound include (meth)acrylic acid esters having a non-acid-dissociative aliphatic polycyclic group and vinyl group-containing aromatic compounds. As the non-acid-dissociative aliphatic polycyclic group, a tricyclodecanyl group, an adamantyl group, a tetracyclododecanyl group, an isobornyl group, and a norbornyl group are preferable from a viewpoint of industrial availability. The aliphatic polycyclic group may have a linear or branched alkyl group having 1 to 5 carbon atoms as a substituent.

Examples of the (meth)acrylic acid esters having a non-acid-dissociative aliphatic polycyclic group include structures represented by the following Formulae (b8-1) to (b8-5).

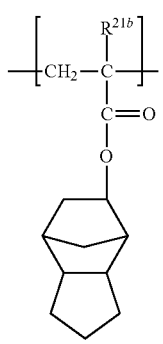

(b8-1)

(b8-2)

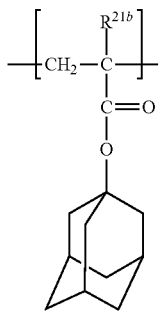

(b8-3)

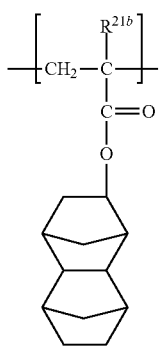

(b8-4)

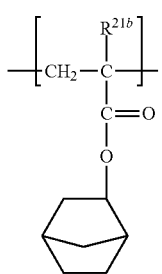

(b8-5)

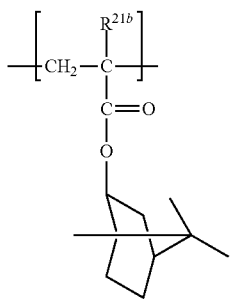

In Formulae (b8-1) to (b8-5), $R^{21b}$ represents a hydrogen atom or a methyl group.

The acrylic resin (B4) is preferably a copolymer having a structural unit represented by the formula (b5), a structural unit derived from (meth)acrylic acid, a structural unit derived from (meth)acrylic acid alkyl esters, and a structural unit derived from (meth)acrylic acid aryl esters.

As the copolymer, a copolymer represented by the following formula (b9) is preferable.

(b9)

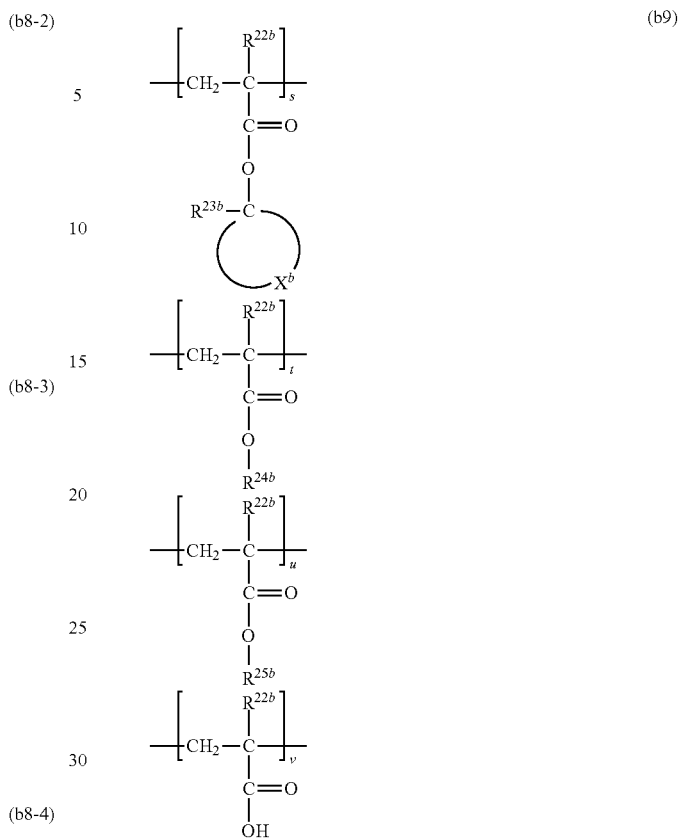

In the formula (b9), $R^{22b}$ represents a hydrogen atom or a methyl group, $R^{23b}$ represents a linear or branched alkyl group having 2 to 4 carbon atoms, $X^b$ has the same definition as the above, $R^{24b}$ represents a linear or branched alkyl group having 1 to 6 carbon atoms or an alkoxyalkyl group having 1 to 6 carbon atoms, and $R^{25b}$ represents an aryl group having 6 to 12 carbon atoms.

Further, in the copolymer represented by the formula (b9), s, t, u, and v represent a molar ratio of each structural unit, s is 8 mol % to 45 mol %, t is 10 mol % to 65 mol %, u is 3 mol % to 25 mol %, and v is 6 mol % to 25 mol %.

The mass average molecular weight of the acrylic resin (B4) in terms of polystyrene is preferably 10,000 to 600,000, more preferably 20,000 to 400,000, and still more preferably 30,000 to 300,000. If the acrylic resin (B4) has such a mass average molecular weight, it is possible to maintain sufficient strength of the photosensitive resin layer without deteriorating peeling properties with the substrate, and further prevent swelling of profiles in plating, and generation of cracks.

It is preferable for the resin (B) to have 1.05 or more of dispersivity. Here, the dispersivity is a value obtained by dividing the mass average molecular weight by the number average molecular weight. If the resin (B) has such dispersivity, it is possible to avoid decrease in adhesiveness with the substrate.

The content of the resin (B) is preferably 5 mass % to 60 mass % and more preferably 15 mass % to 40 mass %, with respect to the total mass of the photosensitive resin composition containing a solvent before coating of the present invention.

The resin (B) may be used alone, or two or more thereof may be used in combination.

The resin (B) necessarily contains at least one resin whose solubility in alkali increases by the acid generated from the aforementioned acid generator (A1).

Alkali-Soluble Resin (C)

The photosensitive resin composition of the present invention may further contain an alkali-soluble resin (C) in order to enhance crack resistance. The alkali-soluble resin as mentioned herein may be determined as follows. A solution of the resin having a resin concentration of 20 mass % (solvent: propylene glycol monomethyl ether acetate) is used to form a resin film having a film thickness of 1 μm on a substrate, followed by immersion in an aqueous 2.38 mass % TMAH solution for 1 min. If the resin was dissolved in an amount of 0.01 μm or more, the resin is defined to be alkali-soluble. The alkali-soluble resin (C) is preferably at least one resin selected from the group consisting of a novolac resin (C1), a polyhydroxystyrene resin (C2), and an acrylic resin (C4).

Novolac Resin (C1)

The novolac resin (C1) is not particularly limited, and the resin can be arbitrarily selected from substances which can be commonly used as a film forming substance in the positive-type photoresist composition. Preferably, a novolac resin obtained by a condensation reaction between an aromatic hydroxy compound and aldehydes or ketones can be exemplified.

Examples of the aromatic hydroxy compound used in the synthesis of the novolac resin (C1) include phenol; cresols such as m-cresol, p-cresol, and o-cresol; xylenols such as 2,3-xylenol, 2,5-xylenol, 3,5-xylenol, and 3,4-xylenol; alkylphenols such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, and 2-tert-butyl-5-methylphenol; alkoxyphenols such as p-methoxyphenol, m-methoxyphenol, p-ethoxyphenol, m-ethoxyphenol, p-propoxyphenol, and m-propoxyphenol; isopropenylphenols such as o-isopropenylphenol, p-isopropenylphenol, 2-methyl-4-isopropenylphenol, and 2-ethyl-4-isopropenylphenol; arylphenols such as phenylphenol; and polyhydroxy phenols such as 4,4'-dihydroxybiphenyl, bisphenol A, resorcinol, hydroquinone, and pyrogallol. These may be used alone or two or more thereof may be used in combination.

Examples of the aldehyde used in the synthesis of the novolac resin (C1) include formaldehyde, paraformaldehyde, trioxane, acetaldehyde, propionaldehyde, butylaldehyde, trimethylacetaldehyde, acrolein, crotonaldehyde, cyclohexane aldehyde, furfural, furylacrolein, benzaldehyde, terephthalaldehyde, phenylacetaldehyde, α-phenylpropyl aldehyde, β-phenylpropyl aldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, and cinnamic acid aldehyde. These may be used alone or two or more thereof may be used in combination.

Among these aldehydes, formaldehyde is preferable from a viewpoint of easy availability, but in order to enhance heat resistance, a combination of hydroxybenzaldehydes and formaldehyde is particularly preferably used.

Examples of the ketone used in the synthesis of the novolac resin (C1) include acetone, methylethylketone, diethylketone, and diphenylketone. These may be used alone or two or more thereof may be used in combination. Furthermore, the aldehydes and ketones may be used by appropriately being combined with each other.

The novolac resin (C1) can be produced by the condensation reaction between the aromatic hydroxy compound and the aldehydes or ketones in the presence of an acid catalyst by means of the well-known method. At this time, as the acid catalyst, hydrochloric acid, sulfuric acid, formic acid, oxalic acid, or paratoluene sulfonic acid can be used.

If o-cresol is used, a hydrogen atom of a hydroxyl group in the resin is substituted with other substituents, or bulky aldehydes are used, the flexibility of the novolac resin (C1) can be further enhanced.

The mass average molecular weight of the novolac resin (C1) is not particularly limited within a range not impairing the purpose of the present invention, and is preferably 1,000 to 50,000.

Polyhydroxystyrene Resin (C2)

The hydroxystyrene-based resin is generally used for the resist composition, and is not particularly limited if the resin includes a hydroxystyrene structural unit. Examples thereof include a homopolymer of hydroxystyrene, a copolymer of hydroxystyrene and other hydroxystyrene-based monomers or styrene-based monomers, and a copolymer of hydroxystyrene and acrylic acid or methacrylic acid or derivatives thereof.

In the polyhydroxystyrene-based resin, the hydroxystyrene-based structural unit is preferably included in an amount of at least 50 mol % or more and preferably 70 mol % or more, from a viewpoint of addition reactivity of the acid-dissociative dissolution-controlling group.

Among these, a copolymer including a hydroxystyrene-based structural unit and at least a styrene-based structural unit other than that is preferable, from a viewpoint of obtaining the resist composition having high heat resistance and high sensitivity.

The mass average molecular weight of the polyhydroxystyrene resin (C2) is not particularly limited within a range not impairing the purpose of the present invention, and is preferably 1,000 to 50,000.

Acrylic Resin (C4)

The acrylic resin (C4) preferably includes a structural unit derived from the polymerizable compound having an ether bond and a structural unit derived from the polymerizable compound having a carboxyl group.

Examples of the polymerizable compound having an ether bond include (meth)acrylic acid derivatives having an ether bond and an ester bond such as 2-methoxyethyl(meth)acrylate, methoxytriethylene glycol(meth)acrylate, 3-methoxybutyl(meth)acrylate, ethylcarbitol(meth)acrylate, phenoxypolyethylene glycol(meth)acrylate, methoxypolypropylene glycol(meth)acrylate, and tetrahydrofurfuryl (meth)acrylate. The polymerizable compound having an ether bond is preferably, 2-methoxyethyl acrylate or methoxytriethylene glycol acrylate. These polymerizable compounds may be used alone or in combination of two or more types thereof.

Examples of the polymerizable compound having a carboxyl group include monocarboxylic acids such as acrylic acid, methacrylic acid, and crotonic acid; dicarboxylic acids such as maleic acid, fumaric acid, and itaconic acid; and a compound having a carboxyl group and ester bond such as 2-methacryloyloxyethyl succinic acid, 2-methacryloyloxyethyl maleic acid, 2-methacrylolyoxyethyl phthalic acid, or 2-methacryloyloxyethyl hexahydrophthalic acid. The polymerizable compound having a carboxyl group is preferably acrylic acid or methacrylic acid. These polymerizable compounds may be used alone or in combination of two or more types thereof.

The mass average molecular weight of the acrylic resin (C4) is not particularly limited within a range not impairing the purpose of the present invention, and is preferably 50,000 to 800,000.

In a case where the total of the resin (B) and the alkali-soluble resin (C) are set to 100 parts by mass, the content of the alkali-soluble resin (C) is preferably 0 parts by mass to 80 parts by mass and more preferably 0 parts by mass to 60 parts by mass. If the content of the alkali-soluble resin (C) is within the aforementioned range, it is possible to enhance crack resistance and adjust the reduction in film thickness at the time of development.

Acid Diffusion Control Agent (D)

The photosensitive resin composition of the present invention preferably further contains an acid diffusion control agent (D) in order to enhance a photoresist pattern shape, post exposure delay stability, or the like. As the acid diffusion control agent (D), a nitrogen-containing compound (D1) is preferable, and organic carboxylic acid, or oxo acid of phosphorus or derivatives thereof (D2) can be included as necessary.

Nitrogen-Containing Compound (D1)

Examples of the nitrogen-containing compound (D1) include trimethylamine, diethylamine, triethylamine, di-n-propylamine, tri-n-propylamine, tri-n-pentylamine, tribenzylamine, diethanolamine, triethanolamine, n-hexylamine, n-heptylamine, n-octylamine, n-nonylamine, ethylenediamine, N,N,N',N'-tetramethylethylenediamine, tetramethylenediamine, hexamethylenediamine, 4,4'-diaminodiphenylmethane, 4,4'-diaminodiphenylether, 4,4'-diaminobenzophenone, 4,4'-diaminodiphenylamine, formamide, N-methylformamide, N,N-dimethylformamide, acetamide, N-methylacetamide, N,N-dimethylacetamide, propionamide, benzamide, pyrrolidone, N-methylpyrrolidone, methylurea, 1,1-dimethylurea, 1,3-dimethylurea, 1,1,3,3,-tetramethylurea, 1,3-diphenylurea, imidazole, benzimidazole, 4-methylimidazole, 8-oxyquinoline, acridine, purine, pyrrolidine, piperidine, 2,4,6-tri(2-pyridyl)-S-triazine, morpholine, 4-methylmorpholine, piperazine, 1,4-dimethylpiperazine, 1,4-diazabicyclo[2.2.2]octane, pyridine, 2,6-di-tert-butylpyridine, and 2,6-diphenylpyridine. In addition, a hindered amine compound such as tetrakis(1,2,2,6,6-pentamethyl-4-piperidyl)1,2,3,4-butane tetracarboxylate, a condensate of 1,2,3,4-butane tetracarboxylic acid, 1,2,2,6,6,-pentamethyl-4-piperidinol, and β,β,β',β'-tetramethyl-3,9-(2,4,8,10-tetraoxaspiro[5,5]undecane)-diethanol; and a polymer of dimethyl succinate and 4-hydroxy-2,2,6,6-tetramethyl-1-piperidine ethanol can be used. These may be used alone or two or more thereof may be used in combination.

The nitrogen-containing compound (D1) is generally used within a range of 0 parts by mass to 5 parts by mass and particularly preferably used within a range of 0 parts by mass to 3 parts by mass, with respect to total 100 parts by mass of the resin (B) and the alkali-soluble resin (C).

Organic Carboxylic Acid, or Oxo Acid of Phosphorus or Derivatives Thereof (D2)

Among the organic carboxylic acid, or oxo acid of phosphorus or derivatives thereof (D2), the preferred examples of the organic carboxylic acid include malonic acid, citric acid, malic acid, succinic acid, benzoic acid, and salicylic acid, and salicylic acid is particularly preferable.

Examples of the oxo acid of phosphorus or derivatives thereof include phosphoric acid and derivatives thereof such as esters thereof such as phosphoric acid, phosphoric acid di-n-butyl ester, and phosphoric acid diphenyl ester; phosphonic acid and derivatives thereof such as esters thereof such as phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as esters thereof such as phosphinic acid and phenylphosphinic acid. Among these, phosphonic acid is particularly preferred. These may be used alone or in combination of two or more types thereof.

The organic carboxylic acid or the oxo acid of phosphorus or derivatives thereof (D2) is used generally within a range of 0 parts by mass to 5 parts by mass and particularly preferably within a range of 0 parts by mass to 3 parts by mass, with respect to the total 100 parts by mass of the resin (B) and the alkali-soluble resin (C).

Moreover, in order to form a salt to allow for stabilization, the organic carboxylic acid, or the oxo acid of phosphorous or the derivatives thereof (D2) is preferably used in the same amount as that of the nitrogen-containing compound (D1).

Organic Solvent(S)

The photosensitive resin composition of the present invention contains an organic solvent (S). The type of the organic solvent (S) is not particularly limited within a range not impairing the purpose of the present invention, and can be appropriately selected from the organic solvent which has been used for the chemically amplified positive-type photosensitive resin composition in the related art.

Examples of the organic solvent (S) include ketones such as acetone, methyl ethyl ketone, cyclohexanone, methyl isoamyl ketone, and 2-heptanone; polyols and derivatives thereof, such as ethylene glycol, ethylene glycol monoacetate, diethylene glycol, diethylene glycol monoacetate, propylene glycol, propylene glycol monoacetate, dipropylene glycol, and dipropylene glycol monoacetate and monomethyl ethers, monoethyl ethers, monopropyl ethers, monobutyl ethers, and monophenyl ethers thereof; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, ethyl pyruvate, ethylethoxy acetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanate, 3-methoxybutyl acetate, and 3-methyl-3-methoxybutyl acetate; and aromatic hydrocarbons such as toluene and xylene. These may be used alone or two or more thereof may be used in combination.

The content of the organic solvent (S) is not particularly limited within a range not impairing the purpose of the present invention. The organic solvent (S) is preferably used such that the target resist film thickness is obtained by coating the film one time when the resist composition is applied by a spin coating method.

Other Components

The photosensitive resin composition of the present invention may further contain a polyvinyl resin in order to enhance plasticity. Examples of the polyvinyl resin include polyvinyl chloride, polystyrene, polyhydroxystyrene, polyvinyl acetate, polyvinyl benzoate, polyvinyl methyl ether, polyvinyl ethyl ether, polyvinyl alcohol, polyvinylpyrrolidone, polyvinyl phenol, and a copolymer thereof. The polyvinyl resin is preferably polyvinyl methyl ether from a viewpoint of low glass transition temperature.

In addition, the photosensitive resin composition of the present invention may further contain an adhesion auxiliary agent in order to enhance adhesion to the substrate.

In addition, the photosensitive resin composition of the present invention may further contain a surfactant in order to enhance coating properties, defoaming properties, and leveling properties.

In addition, the photosensitive resin composition of the present invention may further contain an acid, an acid anhydride, or a high boiling point solvent in order to finely adjust the solubility in the developing solution.

Examples of the acid and the acid anhydride include monocarboxylic acids such as acetic acid, propionic acid, n-butyric acid, isobutyric acid, n-valeric acid, isovaleric acid, benzoic acid, and cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid, and syringic acid; polyvalent carboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, butanetetracarboxylic acid, trimellitic acid, pyromellitic acid, cyclopentanetetracarboxylic acid, butanetetracarboxylic acid, and 1,2,5,8-naphthalenetetracarboxylic acid; and acid anhydrides such as itaconic acid anhydride, succinic acid anhydride, citraconic acid anhydride, dodecenylsuccinic acid anhydride, tricarbanilic acid anhydride, maleic acid anhydride, hexahydrophthalic acid anhydride, methyltetrahydrophthalic acid anhydride, Himic acid anhydride, 1,2,3,4-butanetetracarboxylic acid anhydride, cyclopentanetetracarboxylic acid dianhydride, phthalic acid anhydride, pyromellitic acid anhydride, trimellitic acid anhydride, benzophenonetetracarboxylic acid anhydride, ethylene glycol bis trimellitic anhydride, and glycerin tris trimellitic anhydride.

In addition, examples of the high boiling point solvent include N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, and phenyl cellosolve acetate.

In addition, the photosensitive resin composition of the present invention may further contain a sensitizer in order to enhance sensitivity.

The photosensitive resin composition of the present invention may further contain an alkali metal salt. However, the photosensitive resin composition contains the acid generator (A1) and is heated after the composition is applied on the metal surface of the substrate having catalytic activity, and thus the concentration of the generated acid in the photosensitive resin layer can be changed according to a distance from the substrate. Therefore, the photosensitive resin composition does not necessarily contain the alkali metal salt for the same purpose.

Preparation of Photosensitive Resin Composition

The photosensitive resin composition of the present invention may be prepared by mixing and stirring each of the aforementioned components by a common method, and may be prepared by dispersing and mixing the components, if necessary, using a dispersing apparatus such as a dissolver, a homogenizer, or three-roll mill. In addition, after the components are mixed, the mixture may be further filtrated using a mesh, a membrane filter, or the like.

Method for Forming a Photosensitive Resin Layer

The method for forming a photosensitive resin layer of the present invention includes laminating a photosensitive resin layer composed of the aforementioned photosensitive resin composition on the metal surface of the substrate having catalytic activity; and heating the photosensitive resin layer.

The substrate is not particularly limited, if the substrate has a metal (catalytic metal element) having catalytic activity on at least part of the surface in contact with the photosensitive resin layer. However, the substrate preferably has a metal having catalytic activity on the substrate interface area near a boundary of the light-exposed area and unexposed area (more preferably, the entire surface in contact with the area, which is the non-resist section). The substrate may have a metal having catalytic activity on the entire surface in contact with the photosensitive resin layer.

The metal having catalytic activity is not particularly limited, if the metal has activity that catalyzes generation of the acid from the acid generator (A1) in the heating. However, the metal is preferably copper or an alloy including copper and the copper is more preferable. If the photosensitive resin layer is laminated and heated using the photosensitive resin composition containing the acid generator (A1) on the metal surface having catalytic activity, the concentration of the acid generated from the acid generator (A1) in the photosensitive resin layer can be changed by heat diffusion according to a distance from the substrate.

The metal having catalytic activity is not particularly limited, but for example, the metal can be provided on the substrate surface by a thin film forming method such as sputtering, vapor deposition, or the like.

The substrate well-known in the related art can be used, and examples thereof include a substrate for electronic parts and a substrate with a prescribed wiring pattern formed thereon. Examples of the substrate include a silicon wafer, a glass substrate, and a resin substrate. As a material of the wiring pattern, copper, nickel, aluminium, and tungsten can be exemplified.

In a case where the metal having catalytic activity is provided on the substrate surface, another metal or a resin layer may be inserted between the substrate surface and the metal having catalytic activity. For example, after an insulating material such as a silicon oxide film and a resin insulating film, titanium, which is called as a barrier metal, or tantalum, is inserted on the silicon wafer, the metal having catalytic activity such as copper may be provided.

In addition, in the substrate, the area other than the surface in contact with the photosensitive resin layer may be composed of the metal having catalytic activity as well.

The lamination of the photosensitive resin layer composed of the photosensitive resin composition on the metal surface of the substrate having catalytic activity is performed, by applying the photosensitive resin composition on the substrate including the metal having catalytic activity on at least part of its surface. As a method for applying the composition to the substrate, a method such as a spin coating method, a slit-coating method, a roll-coating method, a screen-printing method, an applicator method, a spray coating method can be employed.

Next, the substrate with the film coated thereon is heated (prebaked) to remove a residual solvent and a resist film is formed. The heating condition varies depending on the type of respective components in the composition, a blending ratio, and the thickness of the coated film, but the condition is preferably set to about 60° C. to 150° C. for 60 seconds to 300 seconds.

In the related art, heating after coating is performed in order to remove the solvent contained in the photosensitive resin composition in the related art, generation of the acid from the acid generator (A) is promoted by light exposure after the heating, alkali solubility of the resin (B) whose solubility in alkali increases under the action of an acid in the photosensitive resin composition is enhanced by the generated acid, and thus the exposed area of the photosensitive resin layer is alkali-developed, thereby forming a pattern. In the present invention, it is found that generation of the acid from the acid generator (A1) is promoted in a state where the metal having catalytic activity is in contact with the photosensitive resin layer at the time of heating (prebaking), and thus the concentration of the acid in the photosensitive resin layer can be changed according to a distance from the substrate. In addition, since the alkali solubility of the resin (B) is changed by the generated acid regardless of light exposure, it is possible to impart constant alkali solubility even to the unexposed area.

Since the aforementioned acid generation occurs in the interface area of the metal having catalytic activity, in the aforementioned photosensitive resin layer after heating, preferably, the acid concentration can be graded according to a distance from the substrate, and more preferably, as the layer becomes closer to the interface with the substrate, the acid concentration can be increased.

Since the photosensitive resin layer contains the resin (B) whose solubility in alkali increases under the action of an acid, solubility of the layer in alkali can be increased as the layer becomes closer to the interface with the substrate, depending on the aforementioned concentration of the generated acid.

The film thickness of the photosensitive resin layer is not particularly limited, and is preferably 1 µm to 200 µm, more preferably 2 µm to 100 µm, and particularly preferably 3 µm to 50 µm.

Method for Producing a Photoresist Pattern

The method for producing a photoresist pattern of the present invention includes regioselectively exposing the photosensitive resin layer to light; and developing the exposed photosensitive resin layer to form a photoresist pattern.

A method for regioselectively exposing the layer to light is not particularly limited, and typically, the layer is selectively irradiated (exposed to light) with radiation, for example, an ultraviolet ray having a wavelength of 300 nm to 500 nm or visible light via a predetermined pattern mask.

Low-pressure mercury vapor lamps, high-pressure mercury vapor lamps, ultrahigh-pressure mercury vapor lamps, metal halide lamps, argon gas lasers, and LED may be used for the radiation source of the radiation. Examples of the radiation include micro waves, infrared rays, visible light, ultraviolet rays, X-rays, γ-rays, electron beams, proton beams, neutron beams, and ion beams. The irradiation dose of the radiation may vary depending on the composition of the photosensitive resin composition according to the present invention and the film thickness of the photosensitive resin layer. For example, in a case where an ultrahigh-pressure mercury vapor lamp is used, the dose is 10 mJ/cm$^2$ to 10,000 mJ/cm$^2$. Further, the radiation includes a light ray activating the acid generator (A) in order to generate an acid.

According to post exposure bake (PEB), a deprotection reaction of the resin (B) is promoted by the acid generated by heating using the well-known method, and alkali solubility of the photosensitive resin layer in the exposed area can be further changed. The condition of post exposure bake varies depending on the type of respective components in the composition, a blending ratio, and the thickness of the coated film, and the heating temperature may be 60° C. to 150° C., is generally 70° C. to 140° C., and is preferably 80° C. to 130° C., and the heating time may be about 30 seconds to 600 seconds, is generally 45 seconds to 300 seconds, and is preferably 60 seconds to 180 seconds. The object of the present invention can be achieved even if heating is performed for a period of time longer than the above, but it is not necessary to perform heating in that way from a viewpoint of production efficiency.

The post exposure bake (PEB) is not essential because one of the objects is to secure alkali solubility by promoting the deprotection reaction of the resin (B) by the generated acid. In a case where the deprotection reaction is conducted, which can secure sufficient alkali solubility necessary for development at a temperature of 20° C. to 30° C., which is room temperature, depending on the type of respective components in the composition, a blending ratio, and the thickness of the coated film, in particular, the PEB may not be carried out. However, it is desirable to carry out the PEB in order to reduce standing waves generated by optical interference.

Next, in the developing, for example, a predetermined alkali aqueous solution is used as the developing solution to dissolve and remove an unnecessary area, thereby obtaining a predetermined photoresist pattern.

As the developing solution, an aqueous solution of alkalis such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5,4,0]-7-undecene, and 1,5-diazabicyclo[4,3,0]-5-nonane may be used. Also, an aqueous solution prepared by adding an appropriate amount of a water-soluble organic solvent such as methanol and ethanol, or a surfactant to the aqueous solution of the alkalis may be used as the developing solution.

The developing time varies depending on the composition of the photosensitive resin composition of the present invention and the film thickness of the photosensitive resin layer, but the developing time is generally 0.5 minutes to 30 minutes. The developing condition depends on the type of respective components in the composition, the blending ratio, the thickness of the coated film, and irradiation dose of light exposure. However, since the deprotection reaction is promoted as the unexposed area as well as the exposed area becomes closer to the interface with the substrate, solubility in alkali is increased. Thus, it is possible to change the developing state of the unexposed area by adjusting the developing time. That is, by changing the developing time from short to long, in the cross-sectional shape of the non-resist section in the cross section perpendicular to the substrate and traversing the resist section and the non-resist section in the photoresist pattern, a relationship between the width L1 at an interface (bottom) with the substrate and the width L2 of the surface (top) on the opposite side of the substrate can be changed to L2=L1, L2<L1, and L2<<L1, and a required difference between L1 and L2 can be realized even in the same photosensitive resin layer. The developing condition depends on the type of respective components in the composition, the blending ratio, the thickness of the coated film, and irradiation dose of light exposure, but, for example, in a case where the thickness of the photosensitive resin layer is 3 µm to 50 µm, the developing time may be 0.5 minutes to 10 minutes, and development can be carried out sufficiently for a period of time, preferably 1 minute to 5 minutes and more preferably 1.2 minutes to 4 minutes. In addition, the development may be carried out for one time or by dividing the number of times into a plurality of times (for example, two to three times), and when the development is carried out by dividing the number of times into a plurality of times, it is preferable to use a new developing solution. The object of the present invention can be achieved even if the development is carried out by taking a period of times longer than the above and/or dividing the number of times into a plurality of times more than the above, but it is not necessary to perform in the above way from a viewpoint of production efficiency. The method of the development may be any one of a liquid-filling method, a dipping method, a puddle method, and a spray developing method.

After the development, washing with flowing water is carried out for 30 seconds to 90 seconds, and drying is performed by using a spin dryer, an air gun, an oven, or the like. In this way, a photoresist pattern can be produced.

In the aforementioned way, it is possible to control the shape of the photoresist pattern, and preferably, in a cross-sectional shape of the non-resist section in the cross section perpendicular to the substrate and traversing the resist section and the non-resist section in the photoresist pattern (in the present specification, may be simply referred to as "cross-sectional shape of the non-resist section"), a photoresist pattern can be obtained, in which a relationship between the width L1 at an interface (bottom) with the substrate and the width L2 of the surface (top) on the opposite side of the substrate is represented by $L2 \leq L1$ and preferably $L2<L1$. In addition, a photoresist pattern can be obtained, in which a ratio (L1/L2) of L1 to L2 is preferably 1.00 to 1.80, more preferably 1.01 to 1.50, and still more preferably 1.02 to 1.40.

Further, in the cross-sectional shape of the non-resist section, a photoresist pattern can be obtained, in which the width of the cross section of the non-resist section is greater as the section becomes closer to the interface with the substrate. The photoresist pattern having the non-resist section can be obtained, in which the cross-sectional shape of the resist section in the cross section perpendicular to the substrate and traversing the resist section and the non-resist section in the photoresist pattern (in the present specification, may be simply referred to as "cross-sectional shape of the resist section"), forms an undercut shape at the interface with the substrate. The "undercut shape" in the present specification means a concavity at the side surface of the cross-sectional shape (in other words, interface with the non-resist section) formed by the development of the resist section as JIS C 5603.

Method for Producing a Plated Molded Article

The method for producing a plated molded article of the present invention includes plating the non-resist section (area that has been removed by the developing solution) of the photoresist pattern obtained by the aforementioned method. Specifically, a wiring layer can be formed or a plated molded article such as connecting terminals such as bumps or metal posts can be formed by embedding a conductor such as metals by plating. In addition, there are no particular limitations on the plating treatment method, and various methods that are known in the related art can be employed. As the plating liquid, in particular, liquids for solder plating, copper plating, gold plating, and nickel plating are suitably used. Finally, any residual photoresist pattern is removed by using a stripping solution according to a common method.

As the above, according to the present invention, by coating the metal surface of the substrate having catalytic activity with a chemically amplified positive-type photosensitive resin composition which contains the acid generator (A1) which generates an acid upon light exposure and generates an acid by heating on the metal surface having catalytic activity, and by heating the formed photosensitive resin layer, the concentration of the acid generated from the acid generator (A1) in the photosensitive resin layer can be changed according to a distance from the substrate, preferably the acid concentration can be graded according to the distance from the substrate, and more preferably the acid concentration is more increased as the layer becomes closer to the interface with the substrate. As such, since the acid generated on the metal surface acts on the resin (B) whose solubility in alkali increases under the action of an acid, a photosensitive resin layer whose solubility in alkali is more increased as the layer becomes closer to the interface with the substrate can be obtained. Further, since the method includes photoresist patterning such as light exposure and development, preferably, it is possible to control the shape of the photoresist pattern such that the non-resist section and/or resist section have the aforementioned shape. Since it is possible to obtain a plated molded article formed by using the photoresist pattern in which the vertical width or the width at the interface (bottom) with the substrate is greater than the width of the surface (top) on the opposite side of the substrate, a stabilized plated molded article can be obtained, in which the undercut is not generated and the angle formed by the substrate area near the plated molded article and the plated molded article becomes 90 degrees or more, and thereafter, it is expected that adhesion between the substrate and a filling material is enhanced or a risk of void occurrence is reduced, which means enhancement of device reliability, in the laminating such as filling an insulating material or coating.

EXAMPLES

Hereinafter, Examples of the present invention will be described, but the scope of the present invention is not limited to these Examples.

In the following Examples, the following was used.

Acid Generator

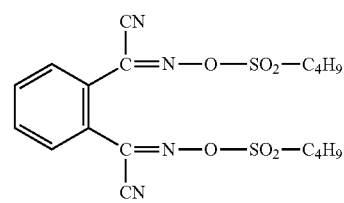

PAG-A

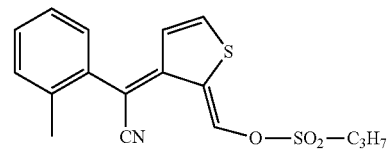

PAG-B

REFERENCE EXAMPLES

As described below, the acid generator (A1) having catalytic activity to copper was selected.

A 1 mass % solution (1) was prepared by dissolving 0.2 g of the acid generator in gamma-butyrolactone (GBL), and heated at a temperature of 100° C. for 20 minutes (3). Separately, a copper-coexistent liquid (2) in which 2 g of copper powder was added to 5 g of the above solution (1) was prepared, and heated at a temperature of 100° C. for 20 minutes (4). It was analyzed whether the acid generator in the respective samples (1) to (4) was decomposed or not using the nuclear magnetic resonance (NMR) and reversed phase chromatography. As the evaluation standard, a sample in which a change in peak was detected was set to decomposed (A), and a sample in which a change in peak was less than the detection limit was set to undecomposed (B). The result obtained by using NMR was shown in Table 1 and the result obtained by using reversed phase chromatography was shown in Table 2. In the present invention, the acid generator having the sample (1) undecomposed, the sample (2) undecomposed, the sample (3) undecomposed, and the sample (4) decomposed is preferable, and PAG-A and PAG-B were selected as the acid generator (A1) from this standard. PAG-A and PAG-B in the heated copper-coexistent solution (4) were decomposed in a ratio about 10 mass % to 50 mass %.

As the copper powder, used was a powder prepared by performing the pretreatment in which the powder was washed with 5% sulfuric acid in advance in order to remove the surface oxide film, the residual acid was removed by washing with pure water, and sequentially, the powder was washed with isopropanol (IPA) and dried for 24 hours or more using a vacuum desiccator to remove the moisture.

In addition, instead of copper, even if a metal powder other than copper or a metal powder mixed with copper is used, the acid generator (A1) and the metal having catalytic activity can be selected in the same manner. The metal powder other than copper is subjected to a proper pretreatment depending on the type of the metal.

TABLE 1

|  | (1) Only dissolved in GBL | (2) Copper is only added | (3) Heating (1) | (4) Heating (2) |
|---|---|---|---|---|
| PAG-A | B | B | B | A |
| PAG-B | B | B | B | A |

TABLE 2

|  | (1) Only dissolved in GBL | (2) Copper is only added | (3) Heating (1) | (4) Heating (2) |
|---|---|---|---|---|
| PAG-A | B | B | B | A |
| PAG-B | B | B | B | A |

Synthesis Example of Resin 1

An addition reaction of ethyl vinyl ether to the novolac resin (molecular weight 5,000 to 6,000, m-cresol/p-cresol=70/30 to 80/20) was carried out in the presence of the acid catalyst, and thus, a novolac resin (resin B1-A) having the addition ratio of 15% to 20% after purification was synthesized.

Preparation Example 1

100 parts by mass of the resin B1-A, 3 parts by mass of the acid generator (PAG-A), 0.2 parts by mass of salicylic acid, and 0.08 parts by mass of triamylamine was dissolved in a mixed solvent of PGMEA/butyl acetate (80/20) and mixed to prepare a chemically amplified positive-type resist composition.

Example 1

The chemically amplified positive-type resist composition obtained in Preparation Example 1 was spin coated on a copper thin layer of a silicon substrate which was prepared by forming a barrier thin layer made of titanium on the surface of a silicone substrate and further the copper thin layer thereon each by sputtering, formed on the surface (hereinafter, the substrate is referred to as "copper sputtering substrate") was spin coated, and then prebaked at a temperature of 100° C. for 180 seconds, thereby forming a photosensitive resin layer having a film thickness of 10 μm. After that, the layer was irradiated with ghi line by an exposing apparatus Prisma GHI 5452 (manufactured by Ultratech, Inc.) using a line and space design mask including a space having a width of 10 μm. Sequentially, after the layer was subjected to post exposure bake (PEB) at a temperature of 100° C. for 90 seconds, the layer was subjected to a puddle development process two times at a liquid temperature of 23° C. for 60 seconds using 2.38% NMD-3 (manufactured by TOKYO OHKA KOGYO CO., LTD.), which is 2.38 mass % of tetramethylammonium hydroxide aqueous solution. After that, the layer was washed with pure water and spin dried (hereinafter, a series of processes such as spin coating, prebaking, light exposing, PEB, developing, washing with pure water, and spin drying are referred to as "patterning").

In addition, the optimal irradiation dose was such an irradiation dose that the aforementioned patterned substrate exhibits a space having a width of 10 μm when measured by CD-SEM (Critical Dimension-Scanning Electron Microscope).

The cross-sectional shape of the photoresist pattern treated with the optimal irradiation dose was observed by the scanning electron microscope (SEM). The SEM photograph is shown in FIG. 1A.

Comparative Example 1

A photoresist pattern was obtained in the same manner as in Example 1 using the chemically amplified positive-type resist composition except that a silicon substrate treated with hexamethyldisilazane (HMDS) is used instead of the copper sputtering substrate, and the cross-sectional shape of the photoresist pattern was observed by the SEM. The SEM photograph is shown in FIG. 1B.

From FIG. 1A, with respect to the cross-sectional shape of the non-resist section in Example 1 in which the photosensitive resin layer was laminated on the copper sputtering substrate, it is determined that a relationship between the width L1 at the interface (bottom) with the substrate and the width L2 of the surface (top) on the opposite side of the substrate is represented by L2≤L1, and specifically, is represented by L2<L1. Moreover, from the same figure, it is determined that the cross-sectional shape of the resist section forms an undercut shape at the interface with the substrate, and the width in the cross-sectional shape of the non-resist section widens in a half sigmoidal shape as the section becomes closer to the interface with the substrate. Judging from the fact that the shape is different from a shape formed by light exposure, the used acid generator is partially decomposed near an area close to the interface with the substrate by a catalytic effect of heat and copper, regardless of light exposure, and the deprotection reaction of the resin proceeds by the generated acid with a distribution in a direction from the bottom to the top. Thus, it is considered that solubility in alkali is more increased as the photosensitive resin layer becomes closer to the interface with the substrate.

Figure 1B:
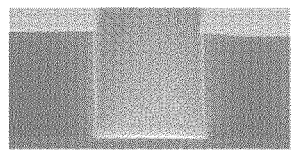

In contrast, from FIG. 1B, with respect to the cross-sectional shape of the non-resist section in Comparative Example 1 in which the photosensitive resin layer was not laminated on the metal surface, it is determined that the width at the interface (bottom) with the substrate and the width of the surface (top) on the opposite side of the substrate are the same as each other. Since it is considered that this shape is a shape formed by light exposure, it is considered that the deprotection reaction of the resin proceeds by the acid generated by light exposure, and solubility in alkali of the unexposed area remains the same regardless of the distance from the substrate.

Example 2

Patterning was performed using the chemically amplified positive-type resist composition in the same manner as in Example 1 except that the condition of prebaking was changed to any of the following conditions 1 to 3. In addition, the optimal irradiation dose was such an irradiation dose that the aforementioned patterned substrate exhibits a space having a width of 10 µm, which is the same as in the mask design, when measured by CD-SEM (Critical Dimension-Scanning Electron Microscope).

Figure 2:
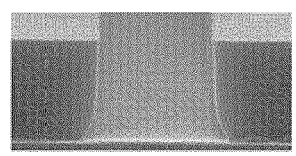
FIG. 2 is a SEM photograph of a cross-sectional shape of the photoresist pattern obtained in Example 2.
Figure 2:
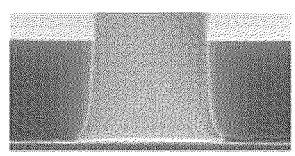
Figure 2:
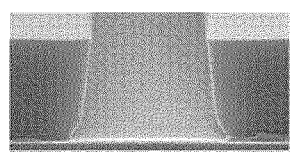

The cross-sectional shape of the photoresist pattern treated with the optimal irradiation dose was observed by the scanning electron microscope (SEM). The SEM photographs are shown in FIG. 2.

Condition 1. Prebaking: at a temperature of 100° C. for 180 seconds
Condition 2. Prebaking: at a temperature of 105° C. for 180 seconds
Condition 3. Prebaking: at a temperature of 110° C. for 180 seconds From FIG. 2, in the cross-sectional shape of the non-resist section, there is a stronger tendency that a relationship between the width L1 at the interface (bottom) with the substrate and the width L2 of the surface (top) on the opposite side of the substrate becomes L2<L1, in a case where the prebaking temperature was 105° C. and 115° C. rather than 100° C. and 105° C. respectively, if the same prebaking time was taken (180 seconds). In addition, it is determined that there is a tendency that a ratio (L1/L2) of L1 with respect to L2 becomes greater, as it is shown that the ratios were 1.27 under the condition 1, 1.28 under the condition 2, and 1.36 under the condition 3. In addition, from the SEM photographs in the same figure, it is determined that there is a tendency that the cross-sectional shape of the resist section forms an undercut shape at the interface with the substrate, in a case where the prebaking temperature was 105° C. and 115° C. rather than 100° C. and 105° C. respectively; a photoresist pattern is obtained, in which in the cross-sectional shape of the non-resist section, the width of the cross section of the non-resist section is greater as the section becomes closer to the interface with the substrate; and the width in the cross-sectional shape of the non-resist section widens in a half sigmoidal shape as the section becomes closer to the interface with the substrate. From the above, it is considered that solubility in alkali is more increased by prebaking as the photosensitive resin layer becomes closer to the interface with the substrate.

Example 3

Patterning was performed using the chemically amplified positive-type resist composition in the same manner as in Example 1 except that the condition of prebaking was changed to any of the following conditions 4 to 6 and post exposure bake (PEB) was performed at a temperature of 90° C. for 90 seconds. In addition, the optimal irradiation dose was such an irradiation dose that the aforementioned patterned substrate exhibits a space having a width of 10 µm, which is the same as in the mask design, when measured by CD-SEM (Critical Dimension-Scanning Electron Microscope).

Figure 3:
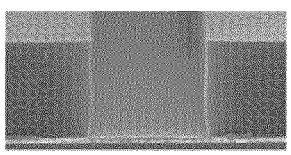
FIG. 3 is a SEM photograph of a cross-sectional shape of the photoresist pattern obtained in Example 3.
Figure 3:
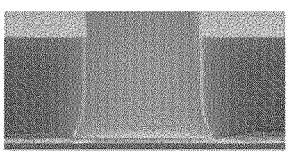
Figure 3:
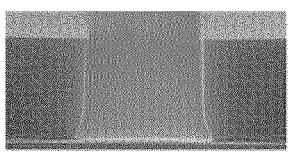

The cross-sectional shape of the photoresist pattern treated with the optimal irradiation dose was observed by the scanning electron microscope (SEM). The SEM photographs are shown in FIG. 3.

Condition 4. Prebaking: at a temperature of 80° C. for 180 seconds
Condition 5. Prebaking: at a temperature of 90° C. for 180 seconds
Condition 6. Prebaking: at a temperature of 100° C. for 180 seconds From FIG. 3, in the cross-sectional shape of the non-resist section, there is a stronger tendency that a relationship between the width L1 at the interface (bottom) with the substrate and the width L2 of the surface (top) on the opposite side of the substrate becomes L2<L1, in a case where the prebaking temperature was 90° C. and 100° C. rather than 80° C. and 90° C. respectively, if the same prebaking time was taken (180 seconds). In addition, it is determined that there is a tendency that a ratio (L1/L2) of L1 with respect to L2 becomes greater, as it is shown that the ratios were 1.06 under the condition 4, 1.20 under the condition 5, and 1.23 under the condition 6. In addition, from the SEM photographs in the same figure, it is determined that there is a tendency that the cross-sectional shape of the resist section forms an undercut shape at the interface with the substrate, in a case where the prebaking temperature was 90° C. and 100° C. rather than 80° C. respectively; a photoresist pattern is obtained, in which in the cross-sectional shape of the non-resist section, the width of the cross section of the non-resist section is greater as the section becomes closer to the interface with the substrate; and the width in the cross-sectional shape of the non-resist section widens in a half sigmoidal shape as the section becomes closer to the interface with the substrate. From the above, it is considered that solubility in alkali is more increased by prebaking (PAB) as the photosensitive resin layer becomes closer to the interface with the substrate.

Example 4

Patterning was performed using the chemically amplified positive-type resist composition in the same manner as in Example 1 except that the prebaking was performed at a temperature of 90° C. for 90 seconds, and the condition of the post exposure bake (PEB) was changed to any one of the following conditions 7 to 9. In addition, the optimal irradiation dose was such an irradiation dose that the aforementioned patterned substrate exhibits a space having a width of 10 µm, which is the same as in the mask design, when measured by CD-SEM (Critical Dimension-Scanning Electron Microscope).

Figure 4:
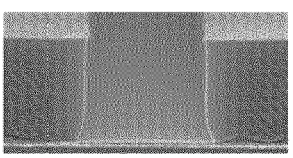
FIG. 4 is a SEM photograph of a cross-sectional shape of the photoresist pattern obtained in Example 4.
Figure 4:
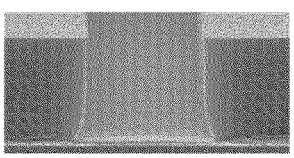
Figure 4:
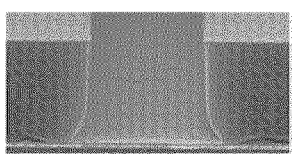

The cross-sectional shape of the photoresist pattern treated with the optimal irradiation dose was observed by the scanning electron microscope (SEM). The SEM photographs are shown in FIG. 4.

Condition 7. PEB: at a temperature of 80° C. for 90 seconds

Condition 8. PEB: at a temperature of 90° C. for 90 seconds

Condition 9. PEB: at a temperature of 100° C. for 90 seconds

From FIG. 4, in the cross-sectional shape of the non-resist section, there is a stronger tendency that a relationship between the width L1 at the interface (bottom) with the substrate and the width L2 of the surface (top) on the opposite side of the substrate becomes L2<L1, in a case where the post exposure bake temperature was 90° C. and 100° C. rather than 80° C. and 90° C. respectively, if the same post exposure bake (PEB) time was taken (90 seconds). In addition, it is determined that there is a tendency that a ratio (L1/L2) of L1 with respect to L2 becomes greater, as it is shown that the ratios were 1.16 under the condition 7, 1.20 under the condition 8, and 1.30 under the condition 9. In addition, from the SEM photographs in the same figure, it is determined that there is a tendency that the cross-sectional shape of the resist section forms an undercut shape at the interface with the substrate, in a case where the post exposure bake temperature was 90° C. and 100° C. rather than 80° C. respectively; a photoresist pattern is obtained, in which in the cross-sectional shape of the non-resist section, the width of the cross section of the non-resist section is greater as the section becomes closer to the interface with the substrate; and the width in the cross-sectional shape of the non-resist section widens in a half sigmoidal shape as the section becomes closer to the interface with the substrate. From the above, it is considered that, in a case where the post exposure bake temperature is higher, solubility in alkali is more increased as the photosensitive resin layer becomes closer to the interface with the substrate.

Example 5

Patterning was performed using the chemically amplified positive-type resist composition in the same manner as in Example 1 except that development was performed every time according to any one of the conditions of 45 seconds two times, 120 seconds one time, 60 seconds two times, 40 seconds three times, 70 seconds two times, and 60 seconds three times as the developing time using a constant amount of new developing solution prescribed by the developing apparatus. In addition, the optimal irradiation dose was such an irradiation dose that the aforementioned patterned substrate exhibits a space having a width of 10 μm, which is the same as in the mask design, when measured by CD-SEM (Critical Dimension-Scanning Electron Microscope).

The cross-sectional shape of the photoresist pattern treated with the optimal irradiation dose was observed by the scanning electron microscope (SEM). The SEM photographs are shown in FIG. 5.

Figure 5:
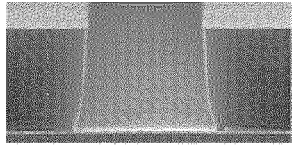
FIG. 5 is a SEM photograph of a cross-sectional shape of the photoresist pattern obtained in Example 5.
Figure 5:
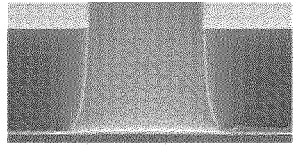
Figure 5:
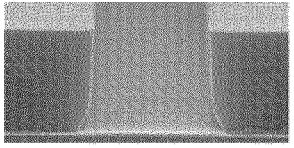
Figure 5:
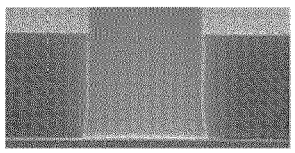
Figure 5:
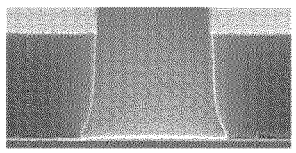
Figure 5:
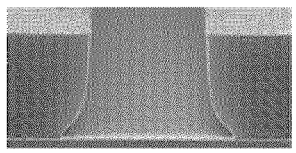

From FIG. 5, in the cross-sectional shape of the non-resist section, there is a stronger tendency that a relationship between the width L1 at the interface (bottom) with the substrate and the width L2 of the surface (top) on the opposite side of the substrate becomes L2<L1, in a case where the development was performed by dividing the number of times into two and three rather than one and two respectively, if the same developing time was taken in total (120 seconds) In addition, it is determined that there is a tendency that a ratio (L1/L2) of L1 with respect to L2 becomes greater, as it is shown that the ratios were 1.25 for one time, 1.27 for two times, and 1.28 for three times.

In addition, from the same figure, it is determined that there is a tendency that the cross-sectional shape of the resist section forms an undercut shape at the interface with the substrate, in a case where total developing time becomes longer such as 90 seconds, 120 seconds, 140 seconds, and 180 seconds; a photoresist pattern is obtained, in which in the cross-sectional shape of the non-resist section, the width of the cross section of the non-resist section is greater as the section becomes closer to the interface with the substrate; and the width in the cross-sectional shape of the non-resist section widens in a half sigmoidal shape as the section becomes closer to the interface with the substrate.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for producing a photoresist pattern, comprising:

laminating a photosensitive resin layer on and in contact with a metal surface comprising a catalytic metal element, wherein the metal surface is a surface of a substrate itself or a thin film formed on a substrate;

the photosensitive resin layer comprises a chemically amplified positive-type photosensitive resin composition that comprises an acid generator (A1) which generates an acid upon irradiation with radiation and generates an acid by heating on the metal surface at a temperature of 90° C. to 150° C., a resin (B) whose solubility in alkali increases under the action of an acid, and an organic solvent (S);

the acid generator (A1) is at least one selected from the group consisting of a compound represented by the following formula (a4) having an oximesulfonate group,

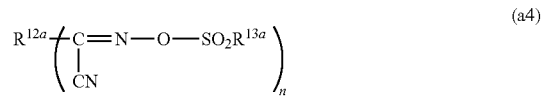

wherein $R^{12a}$ represents a divalent aromatic compound group, $R^{13a}$ represents a substituted or unsubstituted saturated hydrocarbon group, an unsaturated hydrocarbon group or an aromatic compound group, and n=2, and a compound (PAG-B) represented by the following formula;

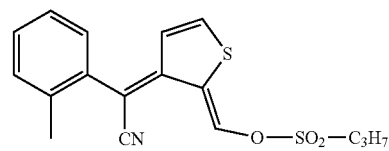

heating the photosensitive resin layer while in contact with the metal surface comprising the catalytic metal element;

regioselectively exposing the photosensitive resin layer to light after heating; and
developing the exposed photosensitive resin layer to form a photoresist pattern,
wherein, in a cross-sectional shape of a non-resist section in a cross section perpendicular to the substrate and traversing a resist section and the non-resist section in the photoresist pattern, a relationship between the width L1 at an interface with the substrate and the width L2 of the surface on the opposite side of the substrate is represented by L2≤L1.

2. The method for producing a photoresist pattern according to claim 1, wherein, in a cross-sectional shape of a non-resist section in the cross section perpendicular to the substrate and traversing a resist section and the non-resist section in the photoresist pattern, the width of the cross section of the non-resist section is greater as the section becomes closer to the interface with the substrate.

3. The method for producing a photoresist pattern according to claim 2, wherein the radiation is ghi line.

4. The method for producing a photoresist pattern according to claim 1, wherein a cross-sectional shape of a resist section in a cross section perpendicular to the substrate and traversing the resist section and a non-resist section in the photoresist pattern forms an undercut shape at an interface with the substrate.

5. A method for producing a plated molded article, comprising plating the non-resist section in the photoresist pattern formed by the method for producing a photoresist pattern according to claim 1.

6. The method for producing a photoresist pattern according to claim 1,
wherein the acid generator (A1) is at least one selected from the group consisting of a compound (PAG-A) represented by the following formula,

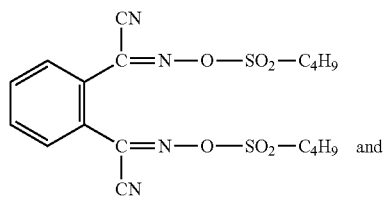

a compound (PAG-B) represented by the following formula

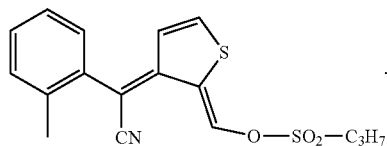

7. The method for producing a photoresist pattern according to claim 1, wherein a ratio (L1/L2) of the width L1 at an interface with the substrate to the width L2 of the surface on the opposite side of the substrate is 1.00 to 1.80.

8. The method for producing a photoresist pattern according to claim 1, wherein the acid generator (A1) generates an acid by heating before exposure (prebake) on the metal surface at a temperature of 90° C. to 150° C. and heating the photosensitive resin layer.

9. The method for producing a photoresist pattern according to claim 1, wherein a metal having catalytic activity constituting the metal surface is copper or an alloy containing copper.

10. The method for producing a photoresist pattern according to claim 1, wherein the acid generator (A1) is decomposed by 10 mass % to 50 mass % when pretreatment is performed on a metal powder constituted of metal having catalytic activity and constituting the metal surface, the metal powder on which the pretreatment has been performed is added to a 1 mass % gamma-butyrolactone solution of the acid generator (A1) in a ratio of 2 to 5 by weight to obtain a metal-powder-coexistent liquid, the metal-powder-coexistent liquid is heated at 100° C. for 20 minutes, and an amount of a decomposition product of the acid generator (A1) is determined with respect to a sample obtained by the heating of the metal-powder-coexistent liquid, the pretreatment including: washing the metal powder with 5% sulfuric acid, then washing with pure water to remove residual acid, and then washing with isopropanol (IPA) and drying for 24 hours or more using a vacuum desiccator to remove moisture.

11. The method for producing a photoresist pattern according to claim 1, wherein the acid generator (A1) is the compound (PAG-B).

12. A method for producing a photoresist pattern, comprising:
laminating a photosensitive resin layer on and in contact with a metal surface comprising a catalytic metal element, wherein the metal surface is a surface of a substrate itself or a thin film formed on a substrate;
the photosensitive resin layer comprises a chemically amplified positive-type photosensitive resin composition that comprises an acid generator (A1) which generates an acid upon irradiation with radiation and generates an acid by heating on the metal surface at a temperature of 90° C. to 150° C., a resin (B) whose solubility in alkali increases under the action of an acid, and an organic solvent (S);
wherein the acid generator (A1) is at least one selected from the group consisting of a compound represented by the following formula (a4) having an oximesulfonate group,

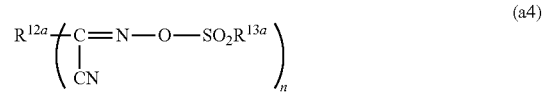

wherein $R^{12a}$ represents a divalent aromatic compound group, $R^{13a}$ represents a substituted or unsubstituted saturated hydrocarbon group, an unsaturated hydrocarbon group or an aromatic compound group, and n=2, and
a compound (PAG-B) represented by the following formula;

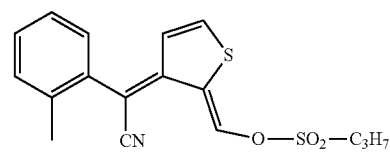

heating the photosensitive resin layer while in contact with the metal surface comprising the catalytic metal element;
regioselectively exposing the photosensitive resin layer to light after heating; and developing the exposed photosensitive resin layer to form a photoresist pattern whose shape is controlled by an acid generated on the metal surface.

13. The method for producing a photoresist pattern according to claim 12,
wherein the acid generator (A1) is at least one selected from the group consisting of a compound (PAG-A) represented by the following formula,

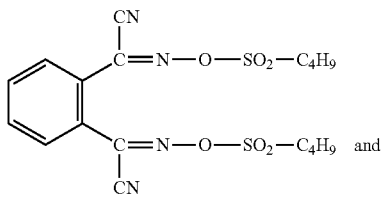

a compound (PAG-B) represented by the following formula

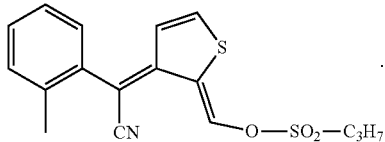

14. The method for producing a photoresist pattern according to claim 12, wherein a ratio (L1/L2) of a width L1 at an interface with the substrate to a width L2 of the surface on the opposite side of the substrate is 1.00 to 1.80.

15. The method for producing a photoresist pattern according to claim 12, wherein the acid generator (A1) generates an acid by heating before exposure (prebake) on the metal surface at a temperature of 90° C. to 150° C. and heating the photosensitive resin layer.

16. The method for producing a photoresist pattern according to claim 12, wherein a metal having catalytic activity constituting the metal surface is copper or an alloy containing copper.

17. The method for producing a photoresist pattern according to claim 12, wherein the acid generator (A1) is decomposed by 10 mass % to 50 mass % when pretreatment is performed on a metal powder constituted of metal having catalytic activity and constituting the metal surface, the metal powder on which the pretreatment has been performed is added to a 1 mass % gamma-butyrolactone solution of the acid generator (A1) in a ratio of 2 to 5 by weight to obtain a metal-powder-coexistent liquid, the metal-powder-coexistent liquid is heated at 100° C. for 20 minutes, and an amount of a decomposition product of the acid generator (A1) is determined with respect to a sample obtained by the heating of the metal-powder-coexistent liquid, the pretreatment including: washing the metal powder with 5% sulfuric acid, then washing with pure water to remove residual acid, and then washing with isopropanol (IPA) and drying for 24 hours or more using a vacuum desiccator to remove moisture.

18. The method for producing a photoresist pattern according to claim 12, wherein the radiation is ghi line; and
in a cross-sectional shape of a non-resist section in a cross section perpendicular to the substrate and traversing a resist section and the non-resist section in the photoresist pattern, the width of the cross section of the non-resist section is greater as the section becomes closer to the interface with the substrate.

19. The method for producing a photoresist pattern according to claim 12, wherein the acid generator (A1) is the compound (PAG-B).

* * * * *